(12) United States Patent
Anthony et al.

(10) Patent No.: US 11,296,734 B2
(45) Date of Patent: *Apr. 5, 2022

(54) METHODS OF DETECTING POWER OF INDIVIDUAL CARRIER OF AGGREGATED CARRIER

(71) Applicant: Skyworks Solutions, Inc., Irvine, CA (US)

(72) Inventors: Edward James Anthony, Robins, IA (US); Reza Kasnavi, Solana Beach, CA (US); John G. Freed, Raleigh, NC (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/061,374

(22) Filed: Oct. 1, 2020

(65) Prior Publication Data

US 2021/0091806 A1    Mar. 25, 2021

Related U.S. Application Data

(60) Continuation of application No. 16/148,858, filed on Oct. 1, 2018, now Pat. No. 10,855,319, which is a
(Continued)

(51) Int. Cl.
*H04B 1/04* (2006.01)
*H04B 1/00* (2006.01)
(Continued)

(52) U.S. Cl.
CPC ............. *H04B 1/0458* (2013.01); *H03F 3/19* (2013.01); *H03F 3/24* (2013.01); *H03F 3/245* (2013.01);
(Continued)

(58) Field of Classification Search
CPC .. H04W 52/52; H04W 52/346; H04W 52/283; H04W 52/286; H04B 1/006;
(Continued)

(56) References Cited

U.S. PATENT DOCUMENTS 5,745,846 A    4/1998    Myer et al.
6,480,703 B1    11/2002    Calderone et al.
(Continued)

FOREIGN PATENT DOCUMENTS

CN    1288296    3/2001
CN    1465153    12/2003
(Continued)

OTHER PUBLICATIONS

LTE Carrier Aggregation, E-UTRA CA configurations 36.101, released Mar. 13, 2016, available at: http://niviuk.free.fr/lte_ca_band.php (accessed Jul. 6, 2016).
(Continued)

*Primary Examiner* — Thanh C Le
(74) *Attorney, Agent, or Firm* — Knobbe, Martens, Olson & Bear, LLP

(57) ABSTRACT

Aspects of this disclosure relate to detecting power associated with an individual carrier of a carrier aggregated signal. In an embodiment, an aggregated carrier including at least a first carrier and a second carrier is provided. An indication of power of the first carrier of the aggregated carrier is detected. Separately from detecting the indication of power of the first carrier, an indication of power of the second carrier of the aggregated carrier is detected. The power associated with a radio frequency (RF) signal provided to an RF source associated with the first carrier can be adjusted based on the indication of power of the first carrier.

20 Claims, 14 Drawing Sheets

Related U.S. Application Data division of application No. 15/190,032, filed on Jun. 22, 2016, now Pat. No. 10,116,339.

(60) Provisional application No. 62/185,507, filed on Jun. 26, 2015.

(51) Int. Cl.

| | | |
|---|---|---|
| *H04L 5/00* | (2006.01) | |
| *H03F 3/24* | (2006.01) | |
| *H03F 3/19* | (2006.01) | |
| *H04W 52/28* | (2009.01) | |
| *H04W 52/34* | (2009.01) | |
| *H04W 52/52* | (2009.01) | |
| *H04L 5/14* | (2006.01) | |

(52) U.S. Cl.
CPC .......... *H04B 1/006* (2013.01); *H04B 1/0057* (2013.01); *H04L 5/001* (2013.01); *H04W 52/283* (2013.01); *H04W 52/286* (2013.01); *H04W 52/346* (2013.01); *H04W 52/52* (2013.01); *H03F 2200/105* (2013.01); *H03F 2200/111* (2013.01); *H03F 2200/171* (2013.01); *H03F 2200/207* (2013.01); *H03F 2200/294* (2013.01); *H03F 2200/451* (2013.01); *H04B 2001/0408* (2013.01); *H04L 5/14* (2013.01)

(58) Field of Classification Search
CPC ...... H03F 3/19; H03F 3/245; H03F 2200/105; H03F 2200/294; H03F 2200/451; H03F 2200/171

See application file for complete search history.

(56) References Cited

U.S. PATENT DOCUMENTS

| | | | |
|---|---|---|---|
| 7,512,388 | B2 | 3/2009 | Snider |
| 7,965,990 | B2 | 6/2011 | Luz et al. |
| 8,218,678 | B2 | 7/2012 | Kim |
| 8,982,801 | B2 | 3/2015 | Shin et al. |
| 9,118,100 | B2 | 8/2015 | Khlat |
| 9,137,804 | B2 | 9/2015 | Lin et al. |
| 9,154,243 | B2 | 10/2015 | Fernando et al. |
| 9,172,441 | B2 | 10/2015 | Granger-Jones et al. |
| 9,203,596 | B2 | 12/2015 | Granger-Jones et al. |
| 9,219,594 | B2 | 12/2015 | Khlat et al. |
| 9,225,382 | B2 | 12/2015 | Khlat |
| 9,602,146 | B2 | 3/2017 | Granger-Jones et al. |
| 9,960,793 | B2 | 5/2018 | Anthony et al. |
| 10,116,339 | B2 | 10/2018 | Anthony et al. |
| 10,218,390 | B2 | 2/2019 | Wloczysiak et al. |
| 10,855,319 | B2 | 12/2020 | Anthony et al. |
| 2011/0201283 | A1 | 8/2011 | Lorenz et al. |
| 2012/0129469 | A1 | 5/2012 | Lorenz et al. |
| 2012/0170624 | A1 | 7/2012 | Rozenblit et al. |
| 2013/0194054 | A1 | 8/2013 | Presti |
| 2013/0324182 | A1 | 12/2013 | Deng et al. |
| 2014/0064730 | A1 | 3/2014 | Ko |
| 2014/0092795 | A1 | 4/2014 | Granger-Jones |
| 2014/0227981 | A1 | 8/2014 | Pecen et al. |
| 2014/0227982 | A1 | 8/2014 | Granger-Jones et al. |
| 2014/0233672 | A1 | 8/2014 | Campos et al. |
| 2014/0329475 | A1 | 11/2014 | Ellä et al. |
| 2016/0036482 | A1 | 2/2016 | Black et al. |
| 2016/0050031 | A1 | 2/2016 | Hwang et al. |
| 2016/0056945 | A1 | 2/2016 | Ellä et al. |
| 2017/0093559 | A1* | 3/2017 | Banowetz ................. H03F 3/24 |
| 2018/0302047 | A1 | 10/2018 | Igarashi et al. |
| 2018/0316312 | A1* | 11/2018 | Sharma ..................... H03F 3/68 |
| 2020/0162030 | A1* | 5/2020 | Drogi ................... G06F 30/367 |

FOREIGN PATENT DOCUMENTS

| | | |
|---|---|---|
| CN | 101247134 | 8/2008 |
| CN | 102694758 | 9/2012 |
| EP | 1 085 662 | 3/2001 |
| JP | 2014/526847 | 10/2014 |
| KR | 10-2008-0048085 | 5/2008 |
| KR | 10-1502439 | 9/2011 |
| KR | 10-2015-0118052 | 10/2015 |
| WO | WO 2012/044131 | 4/2012 |
| WO | WO 2014/169954 | 10/2014 |

OTHER PUBLICATIONS

Skyworks Solutions, Inc., Product Summary: SKY77928-11 SkyLiTE™ Tx-Rx Front-End Module for Quad-Band GSM / GPRS / EDGE w/16 Linear TRx Switch Ports—Dual-Band TD-SCDMA, TDD LTE Band 39—Dual Antenna, Feb. 8, 2016, available at: http://www.skyworksinc.com/uploads/documents/SKY77928_11_203853A.pdf (accessed Jul. 6, 2016).

* cited by examiner

TIME DIVISION DUPLEX WITH NON-OVERLAPPING TRANSMISSION

TIME DIVISION DUPLEX WITH OVERLAPPING TRANSMISSION

METHODS OF DETECTING POWER OF INDIVIDUAL CARRIER OF AGGREGATED CARRIER

CROSS-REFERENCE TO RELATED APPLICATIONS

This application is a continuation of U.S. patent application Ser. No. 16/148,858, filed Oct. 1, 2018 and titled "METHODS OF DETECTING POWER OF INDIVIDUAL CARRIER OF AGGREGATED CARRIER," which is divisional of U.S. patent application Ser. No. 15/190,032, filed Jun. 22, 2016 and titled "DETECTING POWER OF INDIVIDUAL CARRIER OF AGGREGATED CARRIER," which claims the benefit of priority under 35 U.S.C. § 119(e) of U.S. Provisional Patent Application No. 62/185,507, filed Jun. 26, 2015 and titled "POWER DETECTION OF INDIVIDUAL CARRIER OF AGGREGATED CARRIER," the disclosures of each of which are hereby incorporated by reference in their entireties herein. This application is also related to U.S. patent application Ser. No. 15/190,075, filed on Jun. 22, 2016 and titled "POWER DETECTION OF INDIVIDUAL CARRIER OF AGGREGATED CARRIER," the disclosure of which is hereby incorporated by reference in its entirety herein.

BACKGROUND

Technical Field

This disclosure relates to electronic systems and, in particular, to radio frequency (RF) circuits.

Description of the Related Technology

Some systems in an uplink channel for Long Term Evolution (LTE) use a single uplink carrier. The uplink channel can be from a handset to a base station. A carrier can be a signal that is modulated with an input signal to transmit information. The carrier is typically at a significantly higher frequency than the input signal. The carrier can be a radio frequency signal. In LTE systems with a single uplink carrier, power control is typically maintained through the use of one or more directional couplers and one or more associated power detectors. In such systems, there is typically no need to control power of multiple transmissions.

In Advanced-LTE, carrier aggregation can increase bandwidth and consequently increase data transmission rates. Carrier aggregation can combine carriers at a device to increase user data rates across a cell coverage area. Carrier aggregation can provide relatively high peak data rates, increased data rates for all users in a cell, and higher capacity for bursty applications. Specified limits to total carrier power in Advanced-LTE carrier aggregation systems can be difficult to meet.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

An aspect of this disclosure is a carrier aggregation system that includes RF sources, such as power amplifiers, each associated with a separate carrier. The system includes a transmission output configured to provide a carrier aggregated signal. For example, the transmission output can be an output configured to provide the carrier aggregated signal to an antenna, such as a transmission output of a frequency multiplexing circuit (e.g., a diplexer or a triplexer). The carrier aggregated signal includes an aggregation of the separate carriers associated with the RF sources. The apparatus also includes a directional coupler configured to provide an indication of RF power of one of the separate carriers.

The carrier aggregated signal can be in accordance with an Advanced Long Term Evolution standard. The carrier aggregated signal can be an inter-band carrier aggregated signal. Alternatively or additionally, the carrier aggregated signal can be an intra-band carrier aggregated signal.

The system can include a frequency multiplexing circuit, in which the directional coupler is in a signal path between an RF source of the RF sources and the frequency multiplexing circuit. In some other embodiments, the system can include a frequency multiplexing circuit coupled between the RF sources and the directional coupler. A diplexer is an example of a frequency multiplexing circuit.

The system can include a band select switch, in which the directional coupler is in a signal path between an RF source of the RF sources and the band select switch. The system can additionally include a band pass filter, in which the band select switch is coupled between the directional coupler and the band pass filter.

The system can include a second directional coupler and a frequency multiplexing circuit. The directional coupler and the second directional coupler can be associated with different RF sources of the RF sources. The frequency multiplexing circuit can be coupled between the transmission output and the directional coupler and coupled between the transmission output and the second directional coupler.

The system can include a power detector coupled to directional coupler. In some embodiments, the system can include a multi-throw switch coupled between the directional coupler and the power detector.

Another aspect of this disclosure is a power amplifier system with carrier aggregation. The system includes power amplifiers, a transmission output, and a detection output. The power amplifiers include at least a first power amplifier associated with a first carrier and a second power amplifier associated with a second carrier. The transmission output is configured to provide a carrier aggregated signal that includes an aggregation of at least the first carrier and the second carrier. For example, the transmission output can be an output configured to provide the carrier aggregated signal to an antenna, such as a transmission output of a frequency multiplexing circuit (e.g., a diplexer or a triplexer). The detection output is configured to provide an indication of power of an individual carrier of the aggregated carrier. The individual carrier is either the first carrier or the second carrier. The detection output can be, for example, an output of a directional coupler, an output of a power detector, or an output of a frequency multiplexing circuit coupled between a directional coupler and two or more power detectors.

The system can be configured for uplink channel communication. In some embodiments, the system can include a band pass filter and a directional coupler, in which the directional coupler is in a signal path between the first power amplifier and the band pass filter. According to certain embodiments, the system can include a first directional coupler associated with the first power amplifier, a second directional coupler associated with the second power amplifier, and a frequency multiplexing circuit coupled between the transmission output and the first directional coupler and coupled between the transmission output and the second directional coupler. In a number of embodiments, the system can include a directional coupler and a frequency multiplexing circuit coupled between the power amplifiers and the directional coupler.

Another aspect of this disclosure is a carrier aggregation circuit including radio frequency (RF) sources including a first RF source associated with a first carrier and a second RF source associated with a second carrier; a frequency multiplexing circuit configured to provide a carrier aggregated signal, the carrier aggregated signal including an aggregation of the first carrier and the second carrier; and means for providing an indication of RF power of one of the separate carriers.

Another aspect of this disclosure is a mobile wireless communication device. The device includes an antenna configured to transmit radio frequency (RF) signals, power amplifiers each associated with a separate carrier, a frequency multiplexing circuit coupled between the antenna and the power amplifiers, and a directional coupler configured to provide an indication of RF power of a selected one of the separate carriers. The frequency multiplexing circuit is configured to provide a carrier aggregated signal to the antenna, in which the carrier aggregated signal including an aggregation of least two of the separate carriers associated with the power amplifiers.

In certain embodiments, the mobile wireless communication device includes a band select switch, and the directional coupler being disposed in a signal path between a power amplifier of the power amplifiers and the band select switch. According to some embodiments, the mobile wireless communication device includes a band pass filter, and the directional coupler being disposed in a signal path between a power amplifier of the power amplifiers and the band pass filter. In a number of embodiments, the mobile wireless communication device includes a second directional coupler configured to provide an indication of RF power of different one of the separate carriers. According to certain embodiments, the directional coupler is coupled between the frequency multiplexing circuit and the antenna.

Another aspect of this disclosure is a power amplifier module that includes power amplifiers each associated with a separate carrier, a transmission node configured to provide a carrier aggregated signal for transmission, and a directional coupler configured to provide an indication of radio frequency (RF) power of a selected one of the separate carriers. The carrier aggregated signal includes an aggregation of the separate carriers associated with the power amplifiers.

In some embodiments, the power amplifier module includes a band select switch, and the directional coupler being in a signal path between the band select switch and a first power amplifier of the power amplifiers. According to certain embodiments, the power amplifier module includes a transmit/receive switch, and the directional coupler being in a signal path between the band select switch and a first power amplifier of the power amplifiers. The power amplifier module can include a power detector configured to receive the indication of RF power.

The power amplifier module can include a frequency multiplexing circuit coupled between the transmission node and each of the power amplifiers. In some of these implementations, the power amplifier module includes a duplexer coupled between the frequency multiplexing circuit and a power amplifier of the power amplifiers.

Another aspect of this disclosure is a method of detecting power associated with individual carriers of a carrier aggregated signal. The method includes providing an aggregated carrier; detecting an indication of power of a first carrier of the aggregated carrier; and separately from detecting the indication of power of the first carrier, detecting an indication of power of a second carrier of the aggregated carrier.

The method can be performed in a mobile device. The method can further include adjusting a power associated with a radio frequency (RF) signal provided to an RF source associated with the first carrier based at least partly on the indication of power of the first carrier.

In some embodiments, detecting the indication of power of the first carrier can be based on an output of a directional coupler coupled between a frequency multiplexing circuit and an antenna. According to certain embodiments, detecting the indication of power of the first carrier is based on an output of a first directional coupler and detecting the indication of power of the second carrier is based on an output of a second directional coupler. In such embodiments, the first directional coupler can be coupled between a power amplifier and a multi-throw radio frequency switch. In a number of embodiments, detecting the indication of power of the first carrier and detecting the indication of power of the second carrier are both performed using an output of a single directional coupler. For instance, detecting the indication of power of the first carrier can be performed with a first power detector and detecting the indication of power of the second carrier can be performed with a second power detector. In some such embodiments, detecting the indication of power of the first carrier and detecting the indication of power of the second carrier are performed non-concurrently.

Another aspect of this disclosure is an electronically implemented method that includes receiving an indication of power of an individual carrier of an aggregated carrier, the aggregated carrier including an aggregation of the individual carrier and at least another individual carrier; and adjusting a power associated with a radio frequency (RF) signal provided to an RF source based associated with the individual carrier at least partly on the indication of power of the individual carrier. The method can be performed, for example, in a mobile device.

Another aspect of this disclosure is an apparatus that includes a feedback control circuit and an amplifier. The feedback control circuit is configured to receive an indication of power of an individual carrier of an aggregated carrier and to generate a control signal based at least partly on the indication of power of the individual carrier. The amplifier is configured to receive the control signal and to cause a power associated with the individual carrier to be adjusted based at least partly on the control signal.

The apparatus can include a second amplifier. The feedback control circuit can be configured to receive an indication of power of another individual carrier of the aggregated carrier and to generate a second control signal based at least partly on the indication of power of the another individual carrier. The second amplifier can be configured to receive the second control signal. The second amplifier can be configured to cause a power associated with the other individual carrier to be adjusted based at least partly on the second control signal.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

DETAILED DESCRIPTION OF CERTAIN EMBODIMENTS

Figure 1A:
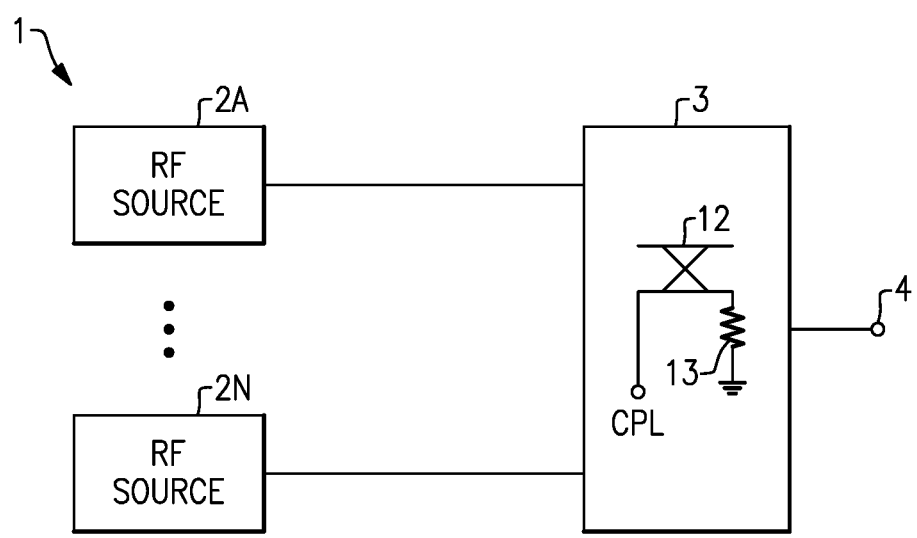
FIG. 1A is a schematic diagram of an electronic system for detecting power of individual carriers of a carrier aggregated signal according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals and/or symbols can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, in Advanced-LTE, carrier aggregation can increase bandwidth and consequently increase data transmission rates. The carrier can be a radio frequency (RF) signal having a frequency in a range from 300 MHz to 300 GHz, such as in a range from about 500 MHz to about 5 GHz for radio frequency signals in LTE systems. RF circuits discussed herein can provide a carrier aggregated RF signal and an indication of power of an individual carrier of the carrier aggregated signal. Carrier aggregation can be used for both Frequency Division Duplexing (FDD) and Time Division Duplexing (TDD). A plurality of carriers or channels can be aggregated with carrier aggregation. For instance, up to five carriers can be aggregated in certain applications. Carrier aggregation can be implemented by contiguous aggregation, in which contiguous carriers within the same operating frequency band are aggregated. Carrier aggregation can alternatively or additionally be non-contiguous, and can include carriers separated in frequency within a common band or in different bands. Advantageously, carrier aggregation can provide relatively high peak data rates, increased data rates for all users in a cell, and higher capacity for bursty applications.

Uplink carrier aggregation for Advanced-LTE systems can benefit from power control of multiple carriers that are transmitted simultaneously. Controlling carrier power such that the combined power of the aggregated carrier does not exceed an authorized power specification for a single carrier can be advantageous. This can result in, for example, about a 3 dB power reduction for each carrier in certain applications, but can vary such that the total power is maintained within a specified limit.

This disclosure provides methods, systems, and apparatus for detecting power of an individual carrier of an aggregated carrier. As such, separate power measurements can be made for two or more individual carriers of the aggregated carrier. This can provide accurate power detection and control of each individual carrier of an aggregated carrier to maintain total power of the aggregated carrier within specified limits. Such methods can be implemented in FDD systems and/or TDD systems, in inter-band carrier aggregations and/or intra-band carrier aggregations, in carrier aggregations and/or systems with various band spacing, in systems with varied target output power, etc. The method of detecting and/or controlling power of an individual carrier of an aggregated carrier and a corresponding system can be dependent on, among other things, the type of system (e.g., FDD system vs. TDD system), characteristics of the carrier aggregation (e.g., intra-band vs. inter-band) and/or particular system specification(s) (e.g., target output power). Any suitable principles and advantages of the methods, systems, and/or apparatus discussed herein can be implemented in a mobile device and/or in connection with an uplink channel from a handset to a base station.

According to an embodiment, a carrier aggregation system includes RF sources, such as power amplifiers, a transmission output, and a directional coupler. Each of the power sources is associated with a separate carrier. The transmission output can provide a carrier aggregated signal that includes an aggregation of the separate carriers associated with the RF sources. A directional coupler is arranged to provide an indication of RF power of one of the separate carriers.

Example system architectures are provided that implement power coupling via radio frequency (RF) directional couplers, power detection, and closed loop feedback such that each carrier's RF output power can be regulated to meet system specifications. Packaged electronic components can include power amplifiers, directional couplers, and switches in accordance with one or more of the embodiments discussed herein. Such packaged components can also include filters and/or diplexers and/or triplexers in certain implementations.

FIG. 1A is a schematic diagram of an electronic system 1 for detecting power of individual carriers of a carrier aggregated signal according to an embodiment. An electronic system arranged to provide a carrier aggregated signal can be referred to as a carrier aggregation system. As illustrated, the electronic system 1 includes RF sources 2A to 2N, aggregation and processing circuitry 3, and a transmission output 4 configured to provide a carrier aggregated signal that includes an aggregation of two or more separate carriers associated with the RF sources. The RF sources 2A to 2N are each associated with a separate carrier. The RF sources 2A to 2N can each include a power amplifier. Any suitable number of RF sources 2A to 2N can be implemented. The aggregation and processing circuitry 3 can receive RF signals from the RF sources 2A to 2N and provide the carrier aggregated signal to the transmission output 4. The transmission output 4 can be any suitable transmission output arranged to provide a carrier aggregated signal. The transmission output 4 can be electrically coupled to an antenna arranged to transmit the carrier aggregated signal. The transmission output 4 can be a terminal of a frequency multiplexer coupled to an antenna. The transmission output 4 can be a port of a directional coupler 12 coupled to an antenna.

The aggregation and processing circuitry 3 can include a directional coupler 12. A termination impedance 13 (e.g., a termination resistor) can be electrically connected to an isolated port of the directional coupler 12. The directional coupler 12 can provide an indication of RF power of a selected one of the separate carriers at a coupled port CPL. A detection output can be any suitable output for providing an indication of power of an individual carrier of the aggregated carrier. The coupled port CPL of the directional coupler 12 can serve as the detection output for providing an indication of power of an individual carrier of the aggregated carrier. In some other implementations, a power detector is coupled to the coupled port CPL of the directional coupler and an output of the power detector can serve as the detection output. According to another implementation, an output of a frequency multiplexing circuit can serve as the detection output, in which the frequency multiplexing circuit is coupled between a directional coupler and two or more power detectors.

One or more directional couplers of the aggregation and processing circuitry 3 can be used to implement accurate power detection of each separate carrier of the carrier aggregated signal, which can be used to control and/or to maintain total power of the carrier aggregated signal within specified limits. The aggregation and processing circuitry 3 can include any other suitable circuitry to process signals from the RF sources 2A to 2N and/or to aggregate signals from the RF sources 2A to 2N. For instance, in addition to at least one directional coupler 12, the aggregation and processing circuitry 3 can include one or more RF switches, one or more band limiting filters, one or more duplexers, one or more frequency multiplexing circuits (e.g., one or more diplexers and/or one or more triplexers), or any combination thereof.

Figure 1B:
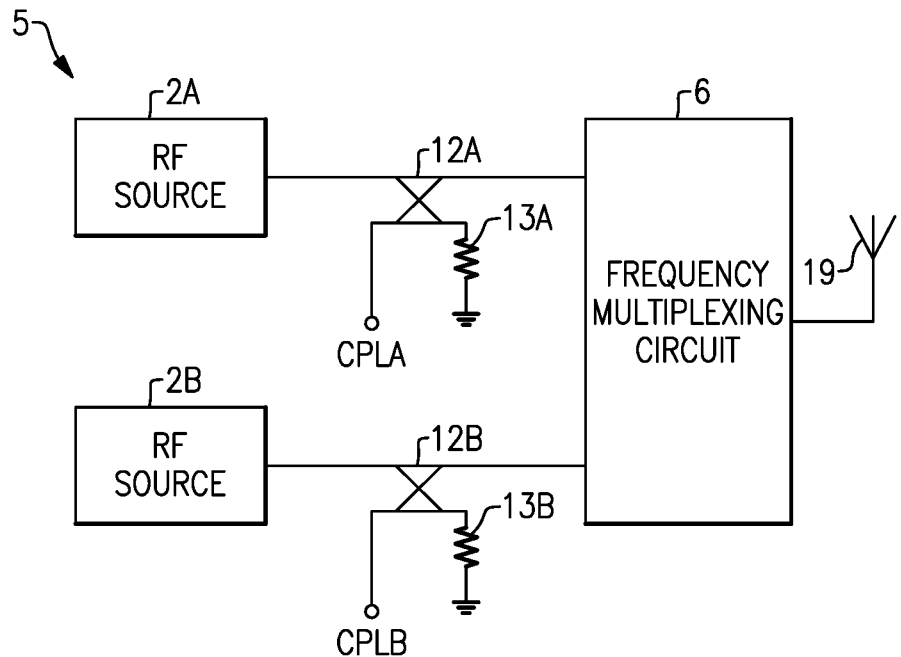
FIG. 1B is a schematic diagram of an example electronic system for detecting power of individual carriers of a carrier aggregated signal according to another embodiment.
Figure 1C:
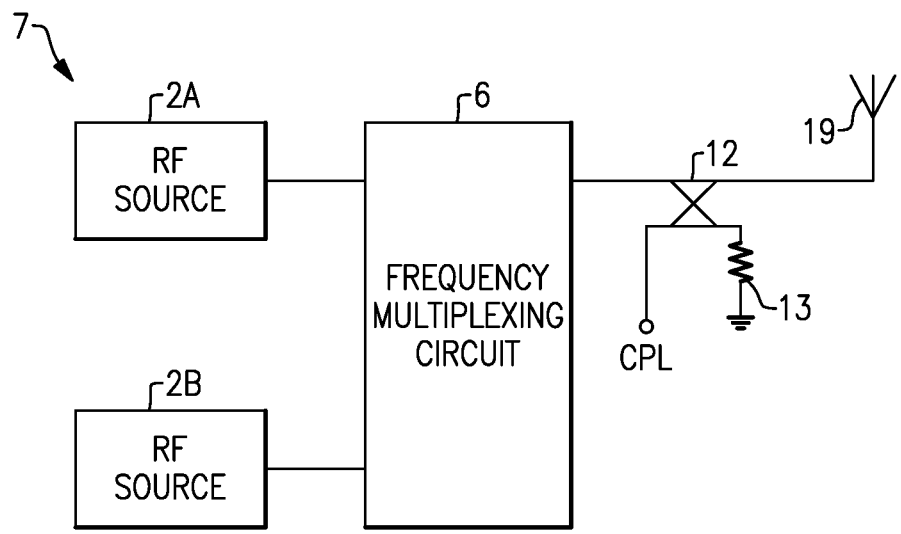
FIG. 1C is a schematic diagram of an example electronic system for detecting power of individual carriers of a carrier aggregated signal according to another embodiment.

FIGS. 1B and 1C are schematic diagrams of example electronic systems for detecting power of individual carriers of a carrier aggregated signal according to certain embodiments. Each of these electronic systems is an example of the electronic system 1 of FIG. 1A that includes additional detail regarding the aggregation and processing circuitry 3 of FIG. 1A and also includes an antenna 19. The electronic systems of FIGS. 1B and 1C each include RF sources, a transmission output, and at least one directional coupler. As illustrated, these systems also include a frequency multiplexing circuit. The RF sources, such as power amplifiers, are each associated with a separate carrier. The transmission output is configured to provide a carrier aggregated signal that is an aggregation of two or more of the separate carriers associated with the RF sources. The directional coupler is configured to provide an indication of RF power of a selected one of the separate carriers.

FIG. 1B is a schematic diagram of an electronic system 5 for detecting power of individual carriers of a carrier aggregated signal according to an embodiment. As shown in FIG. 1B, the electronic system 5 includes RF sources 2A and 2B, directional couplers 12A and 12B with termination impedances 13A and 13B, respectively, a frequency multiplexing circuit 6 (e.g., a diplexer), and an antenna 19. A transmission output 4 can provide a carrier aggregated signal to the antenna 19, in which the carrier aggregated signal is an aggregation of the separate carriers associated with the RF sources 2A and 2B. As illustrated, the transmission output can be a terminal of the frequency multiplexing circuit 6 that is electrically coupled to the antenna 19. The carrier aggregated signal can be a FDD carrier aggregated signal or a TDD carrier aggregated signal.

The directional couplers 12A and 12B can provide an indication of RF power for individual carriers at coupled ports CPLA and CPLB, respectively. These coupled ports can each serve as a detection output for providing an indication of power of an individual carrier of the aggregated carrier provided at the transmission output. The indication of RF power can also be provided for single carrier cases where non-carrier aggregated signals are provided to the antenna 19. Each directional coupler 12A and 12B can be configured for performance at a particular frequency range associated with a respective carrier of an RF source 2A and 2B, respectively. Moreover, the directional couplers 12A and 12B of the electronic system 5 can be arranged such that they should not impact receive paths, if any, associated with the antenna 19.

Figure 2A:
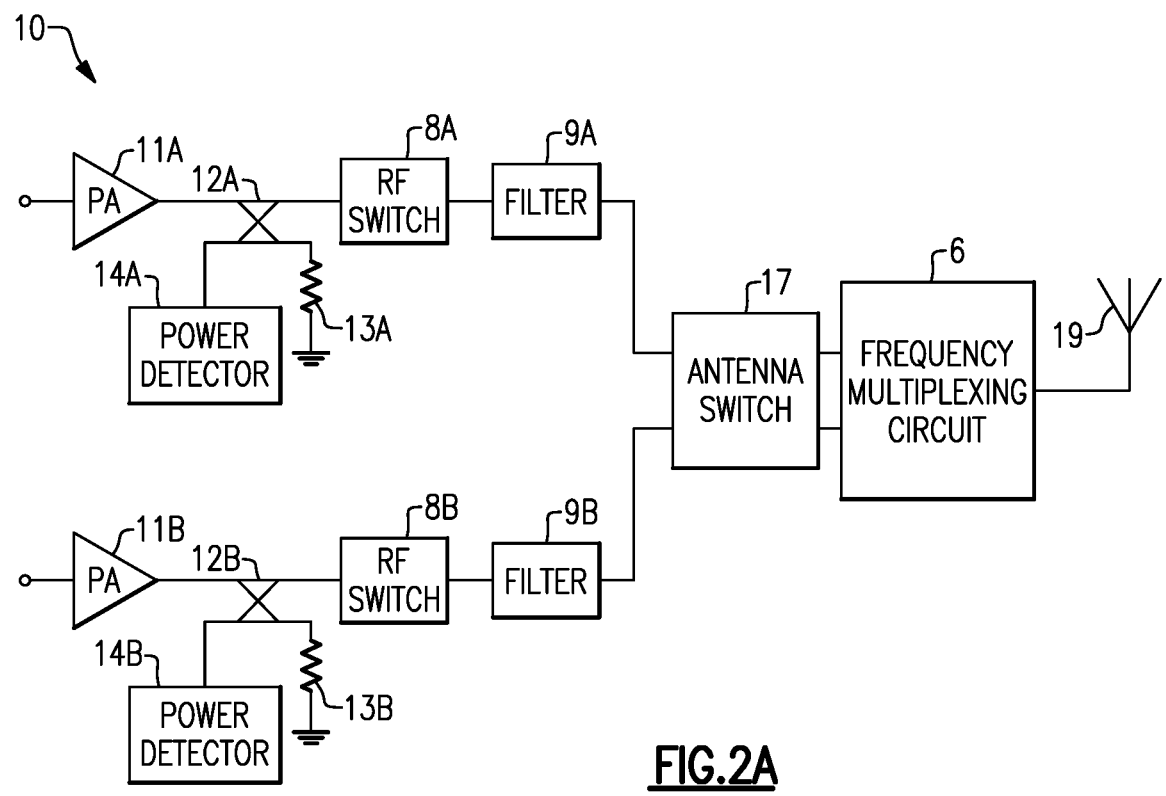
FIG. 2A is a schematic diagram of an electronic system with uplink carrier aggregation and power detection of individual carriers according to an embodiment.
Figure 2B:
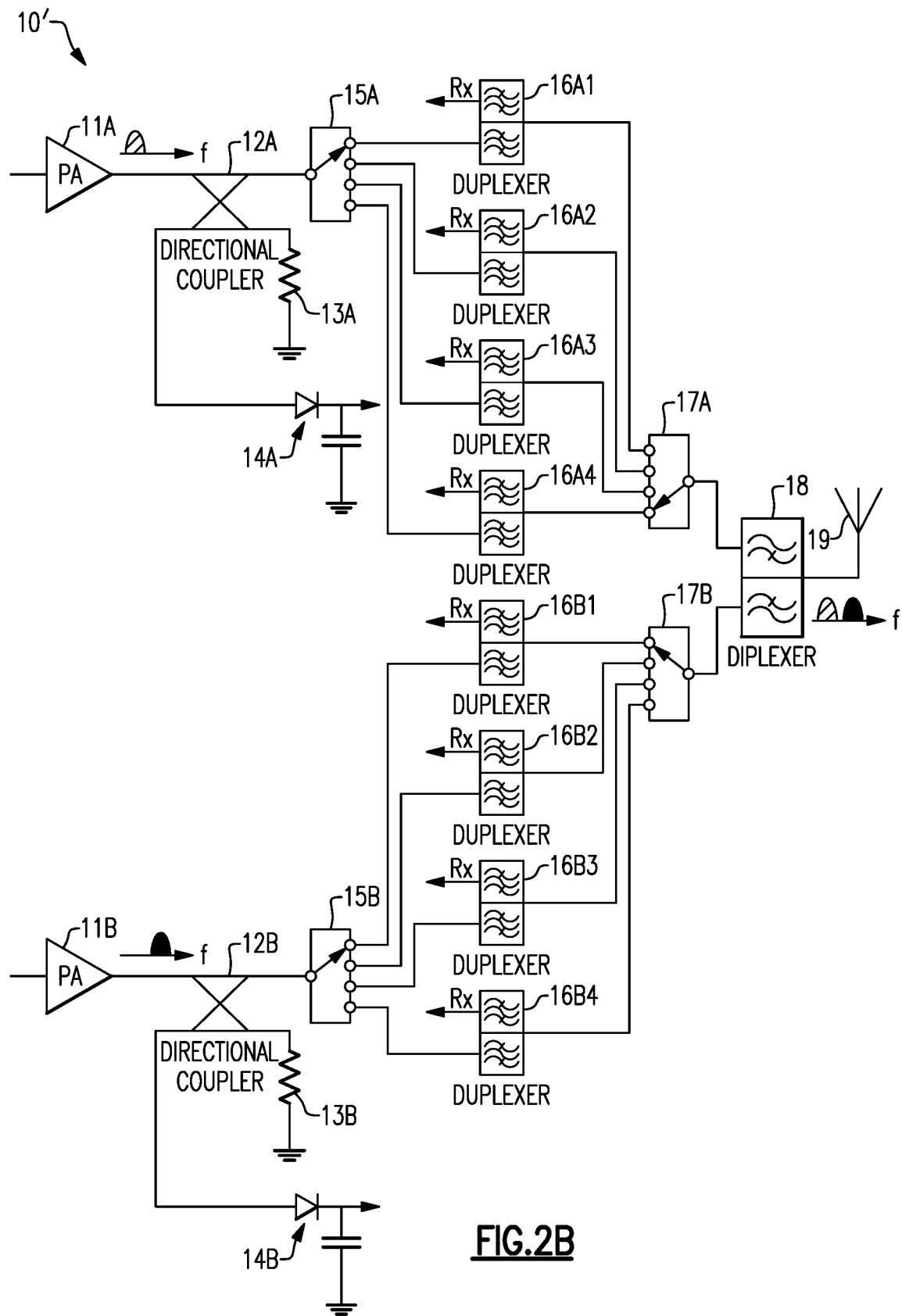
FIG. 2B is a schematic diagram of an electronic system with uplink carrier aggregation and power detection of individual carriers according to another embodiment.
Figure 2C:
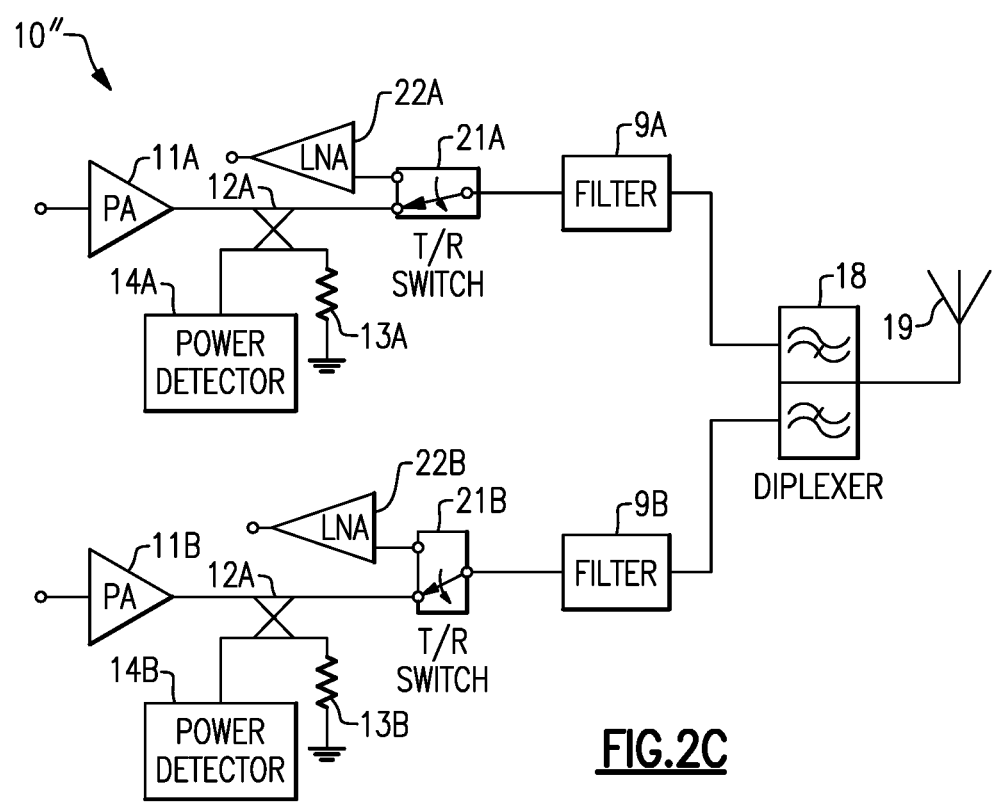
FIG. 2C is a schematic diagram of an electronic system with uplink carrier aggregation and power detection of individual carriers according to another embodiment.

In FIG. 1B, each of the directional couplers 12A and 12B is disposed in a signal path between an RF source 2A and 2B, respectively, and the frequency multiplexing circuit 6. While not illustrated in FIG. 1B, there can also be one or more RF switches and a filter in a signal path between each respective directional coupler 12A and 12B and the frequency multiplexing circuit 6. Examples of such circuits as illustrated in FIGS. 2A to 2C. Moreover, more than two carriers can be aggregated and there can be a similar path for each of the separate carriers that are aggregated in accordance with the principles and advantages discussed herein.

FIG. 1C is a schematic diagram of an electronic system 7 for detecting power of individual carriers of a carrier aggregated signal according to another embodiment. As shown in FIG. 1C, the electronic system 7 includes RF sources 2A and 2B, a frequency multiplexing circuit 6 (e.g., a diplexer), a directional coupler 12 with a termination impedance 13, and an antenna 19. A carrier aggregated signal provided to the antenna 19 can be an aggregation of the separate carriers associated with the RF sources 2A and 2B. As illustrated, the transmission output can be a port of the directional coupler 12 electrically coupled to the antenna 19. The carrier aggregated signal can be a TDD carrier aggregated signal.

A single directional coupler 12 can provide an indication of RF power for an individual carrier at coupled port CPL associated with the individual carrier being provided to the antenna 19. The electronic system 7 can be implemented with a single direction coupler 12 that can provide an indication of power associated with each individual carrier of a carrier aggregated signal provided by the frequency multiplexing circuit 6. In certain implementations, such as applications with TDD carrier aggregation with non-overlapping transmission, a single power detector can be implemented in connection with the directional coupler 12 to detect power associated with each individual carrier of a carrier aggregated signal. According to some other implementations, such as applications with TDD carrier aggregation with overlapping transmission, there can be a duplexer, duplex filter, or the like disposed between the directional coupler 12 and a plurality of power detectors.

As shown in FIG. 1C, the directional coupler 12 is disposed in a signal path between the frequency multiplexing circuit 6 and the antenna 19. While not illustrated in FIG. 1C, there can also be other circuit elements, such as one or more RF switches, in a signal path between the directional coupler 12 and the antenna 19. Examples of such circuits are illustrated in FIG. 4A. Moreover, there can be additional circuitry disposed in a signal path between the RF sources 2A and 2B, respectively, and the frequency multiplexing circuit 6. Examples of such features as illustrated in FIGS. 3B and 4A.

Inter-band carrier power detection for FDD and/or TDD systems can be implemented using a plurality of directional couplers located in signal paths of individual carriers of an aggregated carrier. Each directional coupler can be disposed between a respective power amplifier of an individual carrier and one or more corresponding band-limiting filters, which can be band pass filters. A band-limiting filter can isolate a radio frequency signal associated with a respective power amplifier from a radio frequency signal from one or more other power amplifiers. Band-limiting filters can mitigate out of band emissions, filter out receive band noise, reject out of band blockers which can create intermodulation (IM) products within the power amplifier, the like, or any combination thereof. This can be prevalent from the alternate transmission in carrier aggregation and such IM products can cause interference with other transmissions and/or receptions. Having directional couplers between a power amplifier output and a band-limiting filter can enable simultaneous power measurements to be made for each carrier without interference from one or more of the other carriers.

FIGS. 2A to 2C illustrate example electronic systems that include a directional coupler in a signal path between a power amplifier for each carrier and a respective band limiting filter. Any suitable principles and advantages of the embodiments discussed with reference to FIGS. 2A to 2C can be implemented in connection with each other and/or in connection with any other embodiments discussed herein. An electronic system that includes a power amplifier can be referred to as a power amplifier system.

FIG. 2A is a schematic diagram of an electronic system 10 with carrier aggregation and power detection of individual carriers according to an embodiment. The electronic system 10 can implement inter-band carrier power detection for FDD and/or TDD. In the electronic system 10, a directional coupler is disposed between a power amplifier and an RF switch, such as band select switch or a transmit/receive switch. Each directional coupler can be arranged for enhanced and/or optimized performance for a particular frequency range associated with a respective carrier. In the electronic system 10, the illustrated directional couplers 12 should not contribute to insertion loss between the antenna 19 and any receive paths (not illustrated).

The illustrated electronic system 10 includes power amplifiers 11A, 11B, directional couplers 12A, 12B, termination impedances 13A, 13B, power detectors 14A, 14B, RF switches 8A, 8B, filters 9A, 9B, antenna switch 17, frequency multiplexing circuit 6, and an antenna 19. A first power amplifier 11A and a second power amplifier 11B can provide radio frequency (RF) signals that can be aggregated at a transmission output, such as the output of the frequency multiplexing circuit 6, for transmission by the antenna 19. The power amplifiers 11A and 11B are examples of RF sources that provide RF signals. The first power amplifier 11A can be associated with a first carrier. The first power amplifier 11A can receive a first carrier and a first input signal and provide a first amplified RF signal. The second power amplifier 11B can be associated with a second carrier that is separate from the first carrier.

Power associated with the first amplified RF signal provided by the first power amplifier 11A can be detected using a first directional coupler 12A and a first power detector 14A. Any suitable termination impedance 13A, such as a 50 Ohm terminating resistor, can be electrically connected to the first directional coupler 12A. As illustrated, the first directional coupler 12A can be disposed in a signal path between the first power amplifier 11A and a filter 9A. An RF switch 8A can selectively electrically connect the first power amplifier 11A to the filter 9A.

Power associated with a second amplified RF signal provided by the second power amplifier 11B can be detected using the second directional coupler 12B. The second power detector 14B can provide an indication of power of the second carrier in the electronic system 10. The second directional coupler 12B and the second power detector 14B can detect power associated with the RF signal provide by the second power amplifier 11B. An RF switch 8B can selectively electrically connect the second power amplifier 11A to the filter 9B. The filters 9A and 9B can have different pass bands. For instance, the pass bands of the filters 9A and 9B can correspond to different sub-bands within a transmit band defined by an LTE standard and/or to different transmit bands defined by an LTE standard. The RF switches 8A and 8B can be multi-throw RF switches.

The antenna switch 17 can selectively electrically connect the first filter 9A and/or the second filter 9B to the frequency multiplexing circuit 6. The frequency multiplexing circuit 6 can provide a carrier aggregated signal to the antenna 19 for transmission.

FIG. 2B is a schematic diagram of an electronic system 10' with uplink carrier aggregation and power detection of individual carriers according to an embodiment. The electronic system 10' can implement inter-band carrier power detection for FDD and/or TDD. In the electronic system 10', a directional coupler is disposed between a multimode, multi-band (MMMB) power amplifier and a band select switch. The circuit shown in FIG. 2B can provide a coupled power path associated with individual carriers in carrier aggregation operations and also for single carrier operations. Each directional coupler can be arranged for enhanced and/or optimized performance for a particular frequency range associated with a respective carrier. For instance, a termination impedance provided to an isolated port of a directional coupler can be selected to have an impedance associated with a particular frequency range of an RF signal provided by a corresponding power amplifier. In the electronic system 10', there is no directional coupler between the antenna and receive paths. This can reduce loss associated with receiving signals from the antenna.

The illustrated electronic system 10' includes power amplifiers 11A, 11B, directional couplers 12A, 12B, termination impedances 13A, 13B, power detectors 14A, 14B, band select switches 15A, 15B, duplexers 16A, 16B, antenna switches 17A, 17B, diplexer 18, and an antenna 19. In the circuit shown in FIG. 2B, a first power amplifier 11A and a second power amplifier 11B can provide radio frequency (RF) signals that can be aggregated for transmission by the antenna 19. FIG. 2B illustrates the frequency domains of example signals provided by the power amplifiers 11A and 11B and the frequency domain of an example carrier aggregated transmit signal provided to the antenna 19. The power amplifiers 11A and 11B are examples of RF sources that provide RF signals. The first power amplifier 11A can be associated with a first carrier. The first power amplifier 11A can receive a first carrier and a first input signal and provide a first amplified RF signal. The second power amplifier 11B can be associated with a second carrier that is separate from the first carrier.

Power associated with the first amplified RF signal provided by the first power amplifier 11A can be detected using a first directional coupler 12A and a first power detector 14A. Any suitable termination impedance 13A, such as a 50 Ohm terminating resistor, can be electrically connected to the first directional coupler 12A. As illustrated, the first directional coupler 12A can be disposed in a signal path between the first power amplifier 11A and a transmit band pass filter of the first duplexer 16A. As illustrated, the first duplexer 16A also includes a receive filter. The band select switch 15A can selectively electrically connect the first power amplifier 11A or other circuit element(s) to the transmit band pass filter of the first duplexer 16A.

Power associated with a second amplified RF signal provided by the second power amplifier 11B can be detected at the same time as power associated with the first amplified RF signal provided by the first power amplifier 11A. In the electronic system 10', the first directional coupler 12A can provide an indication of power of the first carrier and a second directional coupler 12B can provide an indication of power of the second carrier. In addition, the first power detector 14A provides an indication of power of the first carrier and the second power detector 14B provides an indication of power of the second carrier in the electronic system 10'. The second directional coupler 12B and the second power detector 14B can detect power associated with the RF signal provide by the second power amplifier 11B. As illustrated in FIG. 1, the second directional coupler 12B can be disposed in a signal path between the second power amplifier 11B and a transmit band pass filter of the second duplexer 16B. The transmit band pass filter of the second duplexer 16B can have a different pass band than the transmit band pass filter of the first duplexer 16A. For instance, the pass bands of the transmit band pass filters of the duplexers 16A and 16B can correspond to different sub-bands within a transmit band defined by an LTE standard. The band select switch 15B can selectively electrically connect the second power amplifier 11B or other circuit element(s) to the transmit band pass filter of the second duplexer 16B. The band select switches 15A, 15B can be multi-throw, RF switches.

In the illustrated electronic system 10', relatively high isolation of each detected carrier signal from the other carrier can be provided due to isolation provided by one or more of (1) out-of-band filtering of each duplexer 16A/16B, (2) out-of-band isolation of the antenna diplexer 18, and (3) the directivity of a forward port of the directional coupler 12A or 12B to the reverse-traveling wave of the residual interfering carrier.

A first antenna switch 17A can selectively electrically connect the first duplexer 16A or other circuit elements (e.g., another duplexer associated with a different band of operation) to the diplexer 18. A second antenna switch 17B can selectively electrically connect the second duplexer 16B or other circuit elements to the diplexer 18. The diplexer 18 is a frequency domain multiplexing circuit that can implement frequency domain multiplexing of the RF signals received from the duplexers 16A and 16B, for example, by way of the antenna switches 17A and 17B, respectively.

The electronic system 10' illustrates FDD duplex filters combined via the diplexer 18. Any suitable principles and advantages discussed with reference to the electronic system 10' can be implemented in connection with other electronic systems, such as TDD aggregation systems with surface acoustic wave (SAW) filter(s), bulk acoustic wave (BAW) filter(s), and/or thin-film bulk acoustic resonator (FBAR) filter(s) with an additional transmit/receive switch for each band and/or an additional transmit/receive throw in each band select switch.

FIG. 2C is a schematic diagram of an electronic system 10" with carrier aggregation and power detection of individual carriers according to another embodiment. The electronic system 10" is like the electronic system 10 of FIG. 2A in which the RF switches 8A and 8B of FIG. 2A are implemented by transmit/receive switches 21A and 21B, respectively, an antenna switch 17 is not shown, and the frequency multiplexing circuit 6 of FIG. 2A is implemented by a diplexer 18. The electronic system 10" is like the electronic system 10' of FIG. 2B except that transmit/receive switches 21A and 21B are implemented in place of band select switches 15A and 15B, respectively, corresponding changes are made to the signal paths between the switches and the diplexer 18, and an antenna switch 17 is not shown. Some embodiments of the electronic system 10" can include an antenna switch 17 in signal paths between filters 9A and 9B and the diplexer 18.

The electronic system 10" includes filters 9A and 9B in signal paths between the transmit/receive switches 21A and 21B and respective ports of the diplexer 18. By contrast, the electronic system 10' of FIG. 2B includes a plurality of duplexers and RF switches electrically coupled between the band select switches 15A and 15B and respective ports of the diplexer 18 of FIG. 2B. The electronic system 10″ also illustrates low noise amplifiers 22A and 22B of receive paths. The filters 9A and 9B shown in FIG. 2C can each be targeted to pass frequencies associated with a particular carrier. For instance, the filter 9A can be configured to pass frequencies associated with a Band 39 carrier in certain implementations. According to some such implementations, the diplexer 18 can provide a carrier aggregated signal to the antenna, in which the carrier aggregated signal aggregates a Band 39 carrier with a Band 41 carrier.

The electronic systems discussed herein, such as the electronic systems of FIGS. 2A to 2C can be implemented in a variety of electronic modules. An electronic module configured to process an RF signal can be referred to as a radio frequency module. An electronic module that includes one or more power amplifiers can be referred to as a power amplifier module. Electronic modules can be packaged modules that include a plurality of components on a package substrate. Some such packaged modules can be multi-chip modules. FIGS. 2D, 2E, 2F, and 2G are schematic diagrams of example electronic modules according to certain embodiments. Electronic modules can be implemented in accordance with any of the principles and advantages discussed herein. Some or all of the features of any of the electronic systems discussed herein can be implemented in an electronic module.

Figure 2D:
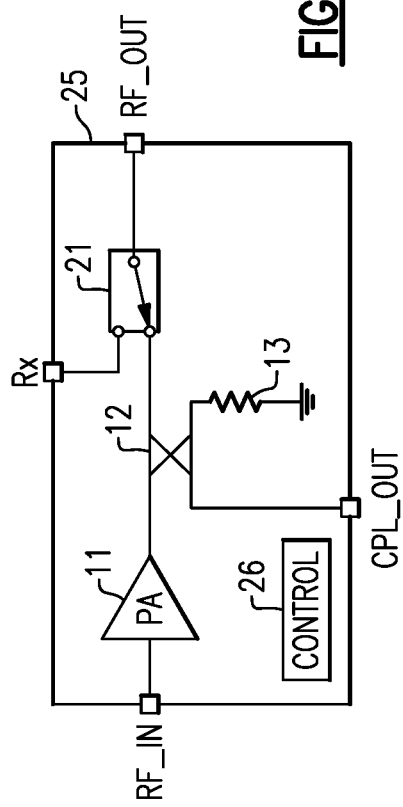
FIGS. 2D, 2E, 2F, and 2G are schematic diagrams of example electronic modules according to certain embodiments.

FIG. 2D is a schematic diagram of an example electronic module 25 according to an embodiment. The electronic module 25 can implement part of the electronic system 10″ of FIG. 2C. As illustrated, the electronic module 25 includes a power amplifier 11, a directional coupler 12 with a termination impedance 13, a transmit/receive switch 21, and a control circuit 26. The electronic module 25 has a contact RF_IN (e.g., pin, bump, or the like) configured to receive an RF input for transmission. The electronic module 25 has a contact CPL_OUT arranged to provide an indication of RF power associated with the RF signal provided by the power amplifier 11, a contact RX arranged to provide a receive signal, and a contact RF_OUT configured to provide an RF transmission output. In one application, the electronic module 25 can be used to provide a band 39 carrier in a band 39/band 41 uplink carrier aggregation system.

Figure 2E:
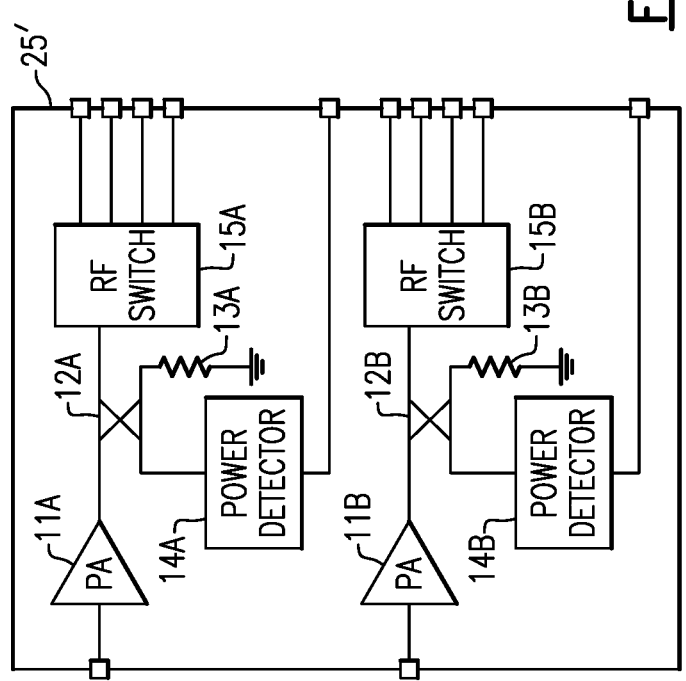

FIG. 2E is a schematic diagram of an example electronic module 25′ according to an embodiment. The electronic module 25′ can implement part of the electronic system 10′ of FIG. 2B. As illustrated, the electronic module 25′ includes power amplifiers 11A and 11B, directional couplers 12A and 12B with a termination impedances 13A and 13B, respectively, power detectors 14A and 14B, and RF switches 15A and 15B.

Figure 2F:
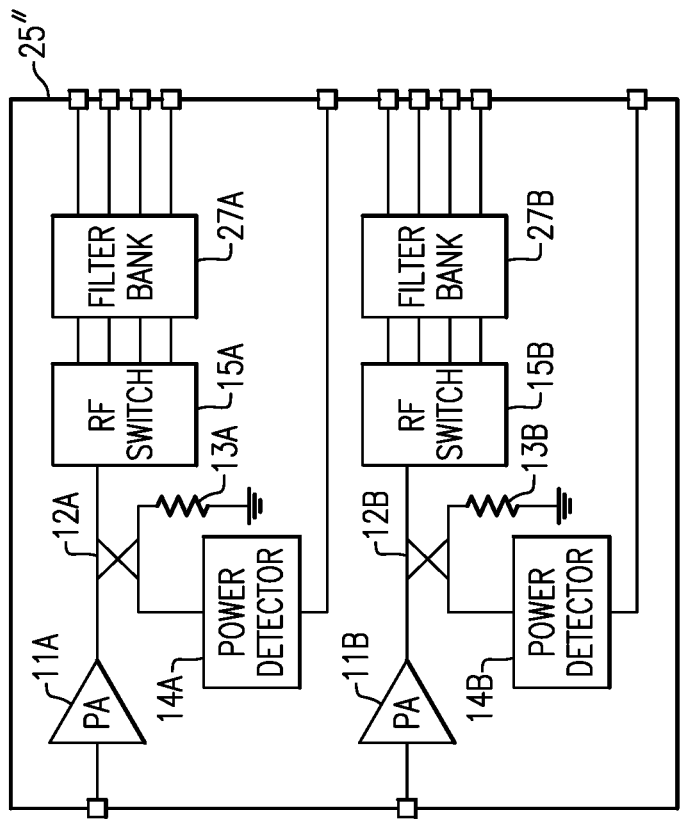

FIG. 2F is a schematic diagram of an example electronic module 25″ according to an embodiment. The electronic module 25″ can implement part of the electronic system 10′ of FIG. 2B. The electronic module 25″ is like the electronic module 25′ of FIG. 2E except that the electronic module 25″ also includes filter banks 27A and 27B. The filter banks 27A and 27B can implement any suitable filtering. For instance, the filter banks 27A and 27B can each implement a bank of transmit filters. As another example, the filter banks 27A and/or 27B can implement transmit and receive filters. In an embodiment, the filter banks 27A and 27B can implement the duplexers of the electronic system 10′ of FIG. 2B.

Figure 2G:
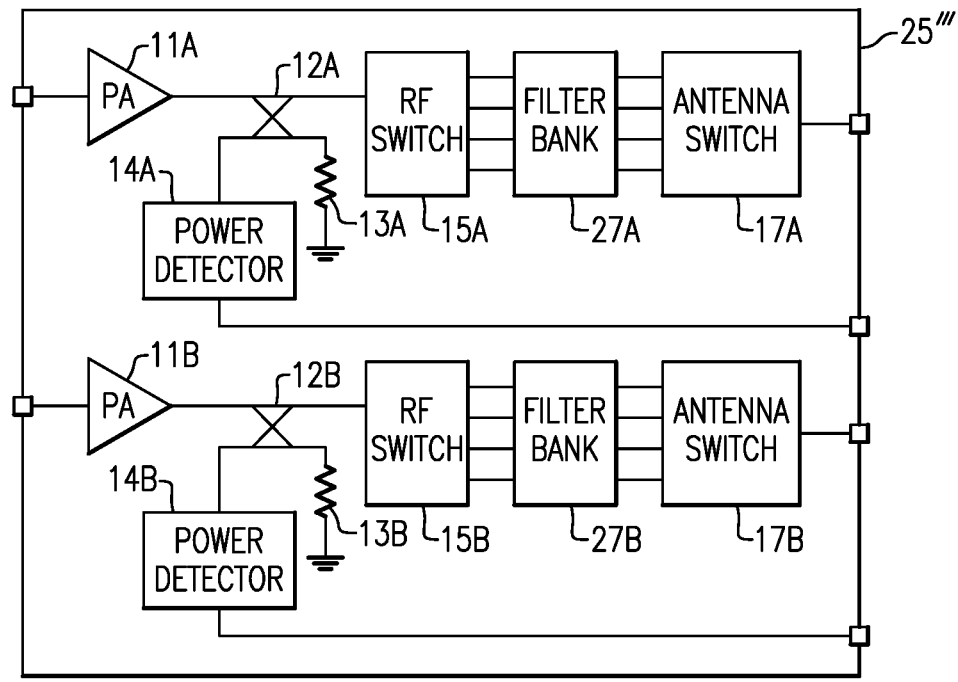

FIG. 2G is a schematic diagram of an example electronic module 25′″ according to an embodiment. The electronic module 25′″ can implement part of the electronic system 10′ of FIG. 2B. The electronic module 25′″ is like the electronic module 25″ of FIG. 2F except that the electronic module 25′″ also includes antenna switches 17A and 17B.

In TDD systems, a single directional coupler can detect RF power associated with each carrier when a transmit slot timing of each carrier does not overlap with another carrier. Accordingly, each carrier can transmit while another channel is in a receive mode or a standby mode. This can implement precise power detection for non-overlapping transmission TDD systems.

Figure 3A:
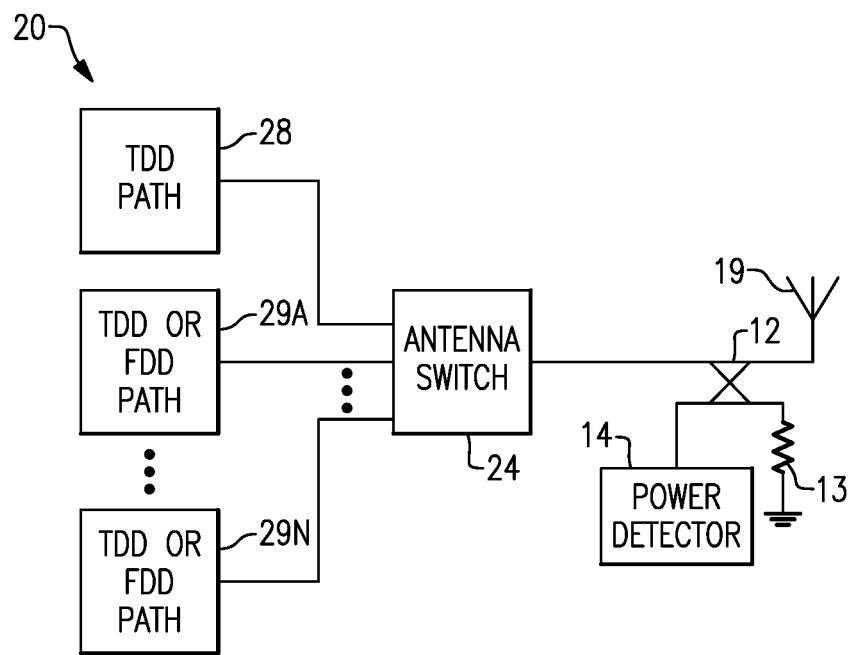
FIG. 3A is a schematic diagram of an electronic system with uplink carrier aggregation and power detection of individual carriers according to an embodiment.
Figure 3B:
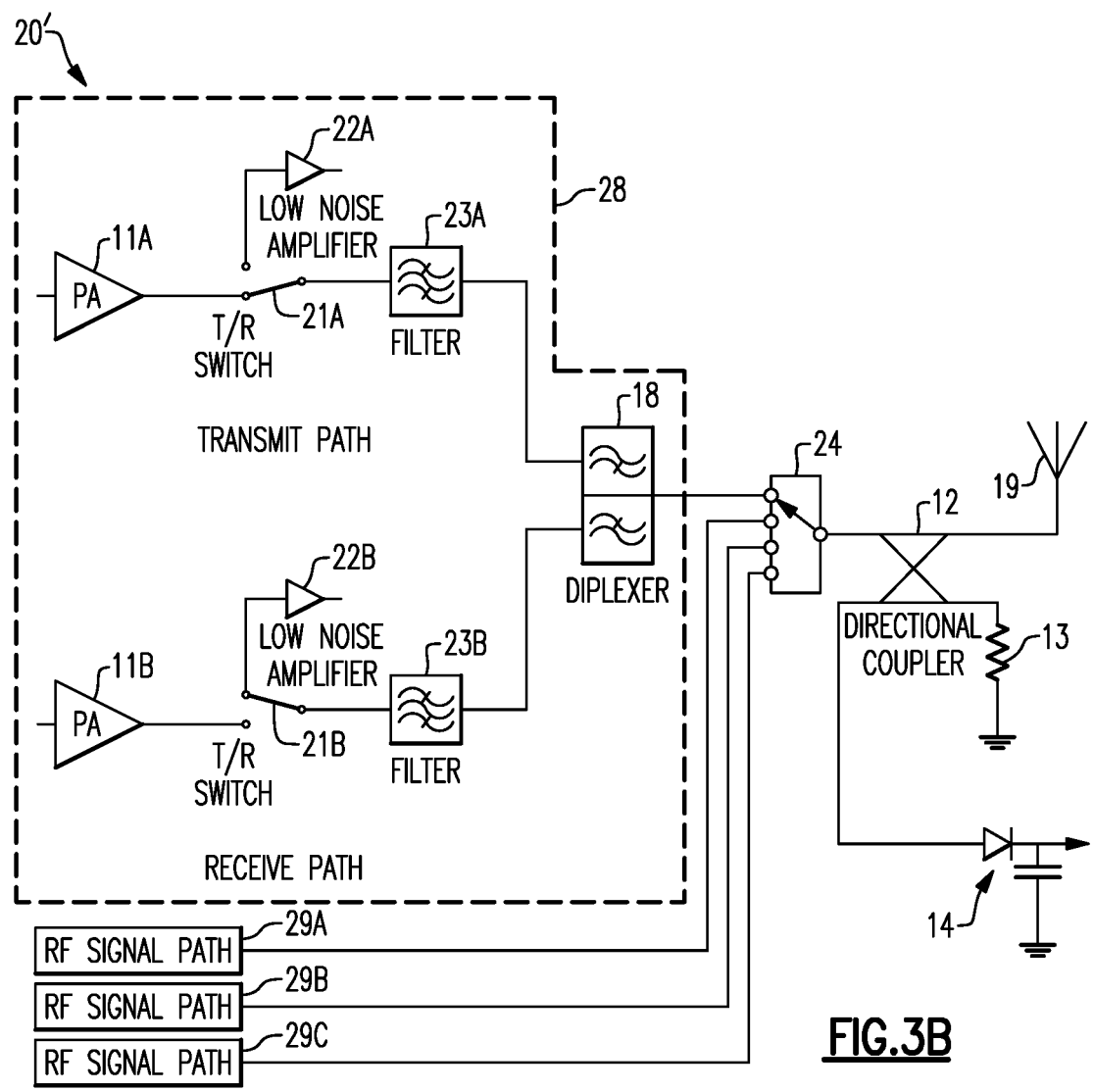
FIG. 3B is a schematic diagram of an electronic system with uplink carrier aggregation and power detection of individual carriers according to another embodiment.
Figure 4A:
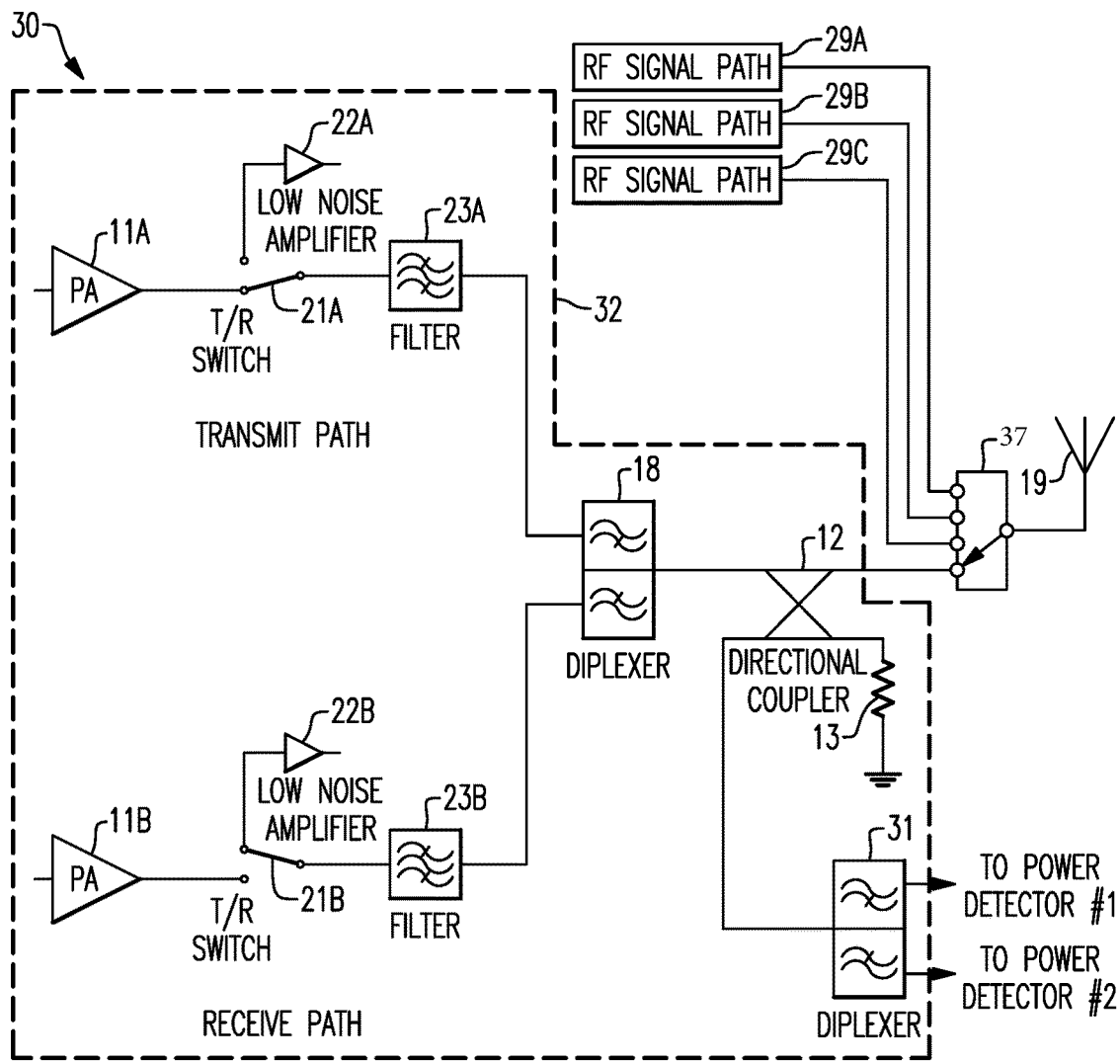
FIG. 4A is a schematic diagram of an electronic system with uplink carrier aggregation and power detection of individual carriers according to another embodiment.

FIGS. 3A and 3B are a schematic diagram of electronic systems with uplink carrier aggregation and power detection of individual carriers according to certain embodiments. These electronic systems can implement power detection of individual carriers of an aggregated carrier in systems configured to transmit non-overlapping transmit TDD carrier aggregation signals. When carrier aggregation is controlled in such a way that transmissions associated with individual carriers do not overlap, effective uplink and downlink data rates can be increased. Power of individual carriers can be detected at different times and an indication of the detected power of each carrier can be used to control power of the respective carrier. TDD with non-overlapping transmission can limit peak power supply/battery current by having only one power amplifier on at a time. The electronic systems of FIGS. 3A and 3B each include a single directional coupler 12 and a single power detector 14 to provide indications of power of individual carriers for providing a closed loop power control of each carrier. According to certain embodiments, the systems of FIGS. 3A and/or 3B can operate in a carrier aggregation mode and in a single carrier mode. Since only one TDD carrier may transmit at any given time in such systems, one directional coupler 12 may be used for either a single carrier signal or an aggregated carrier signal in certain implementations.

FIG. 3A is a schematic diagram of an electronic system 20 with uplink carrier aggregation and power detection of individual carriers according to an embodiment. As illustrated, the electronic system includes a TDD path 28, RF paths 29A to 29N, an antenna switch 24, a directional coupler 12 with a termination impedance 13, a power detector 14, and an antenna 19. The TDD path 28 is configured to provide a TDD carrier aggregated signal to the antenna switch 24. The TDD carrier aggregated signal can be a non-overlapping TDD carrier aggregated signal. RF signal paths 29A to 29N can each provide an RF signal to the antenna switch 24 when active. Any suitable number of RF signal paths can be implemented. The RF signal paths 29A to 29N can be TDD carrier aggregation signal paths and/or FDD carrier aggregation signal paths. The antenna switch 24 can electrically couple a selected signal path to the antenna 19. In a first state, the antenna switch 24 can electrically couple the TDD path 28 to the antenna 19. When the antenna switch 24 is in the first state, the directional coupler 12 can provide an indication of RF power associated an individual carrier being transmitted by the TDD path 28. The directional coupler 12 can also provide an indication of power associated with an RF path 29A to 29N that is electrically coupled to the antenna 19 in different states of the antenna switch 24.

Figure 3C:
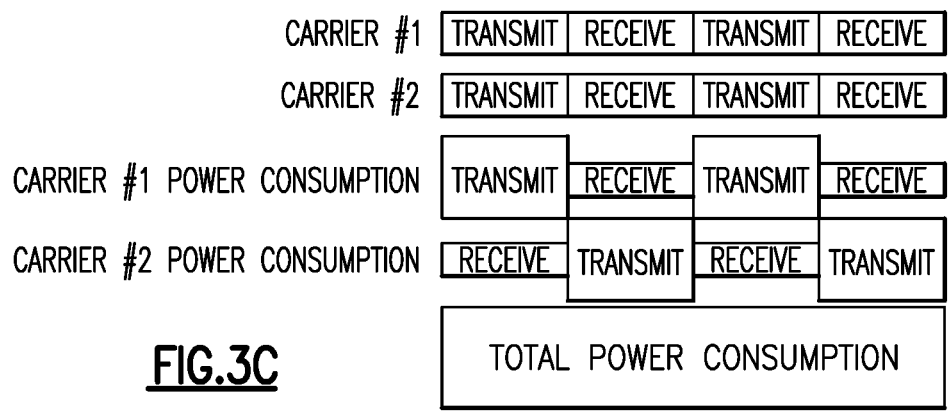
FIG. 3C is an illustrative diagram of timing of time division duplexing with non-overlapping transmission and associated power consumption in the electronic system of FIG. 3B.

FIG. 3B is a schematic diagram of an electronic system 20′ with uplink carrier aggregation and power detection of individual carriers according to an embodiment. The electronic system 20′ can implement power detection of individual carriers of an aggregated carrier in a non-overlapping transmission TDD carrier aggregation system. The illustrated electronic system 20′ includes power amplifiers 11A, 11B, transmit/receive switches 21A/21B, low noise amplifiers 22A/22B, band pass filters 23A, 23B, a diplexer 18, RF signal paths 29A, 29B, and 29C, an antenna switch 24, a directional coupler 12, a termination impedance 13, a power detector 14, and an antenna 19. FIG. 3C is an illustrative diagram of timing of time division duplexing with non-overlapping transmission and associated power consumption in the electronic system 20' of FIG. 3B. An RF path associated with a first carrier can be in transmit mode as illustrated when the first transmit/receive switch 21A is in a state corresponding to transmit mode and the second transmit/receive switch 21B is in a state corresponding to receive mode. The transmit/receive switches 21A and 21B can alternate between transmit and receive modes in accordance with the timing diagram of FIG. 3C. The directional coupler 12 can provide an indication of RF power associated with a first carrier when the first carrier is being transmitted via the antenna 19 and provide an indication of RF power associated with the second carrier when the second carrier is being transmitted via the antenna 19. Based on a signal indicative of the transmit/receive modes of the first carrier and the second carrier, a power control system (e.g., a power control system of FIG. 6A or a power control system of FIG. 6C) can detect which carrier of the aggregated carrier is associated with an output of the directional coupler 12 and an output of the power detector 14.

As shown in FIG. 3B, the antenna switch 24 can electrically couple the TDD carrier aggregation signal path 28 to the antenna 19. The antenna switch 24 can electrically couple a selected one of the RF signal paths 29A, 29B, or 29C to the antenna 19 in other states. Any of the RF signal path 29A to 29C can implement, for example, a non-overlapping TDD carrier aggregation signal path like the TDD carrier aggregation signal path 28. Alternatively or additionally, any of the RF signal paths 29A to 29C can implement an overlapping TDD carrier aggregation signal path, a FDD carrier aggregation signal path, or a single carrier signal path.

The illustrated electronic system 20' can be implemented with individual SAW filters combined via the diplexer 18. Any suitable principles and advantages discussed with reference to the electronic system 20' can be implemented in connection with other electronic systems, such electronic systems with a single SAW duplexer, a single BAW duplexer, or a single FBAR duplexer.

In TDD systems where transmission of both carriers can occur at the same time, a single directional coupler can detect RF power associated with each carrier when coupled signals are separated by way of a diplexer and/or a duplex filter. Separate power detectors can receive coupled signals associated with separate carriers. Each of the separate power detectors can be a relatively simple power detector in certain implementations rather than a more complex tuned receiver-based power detector.

FIG. 4A is a schematic diagram of an electronic system 30 with uplink carrier aggregation and power detection of individual carriers according to an embodiment. The electronic system 30 can implement power detection of individual carriers of an aggregated carrier in a TDD system in which individual carriers are simultaneously transmitted. Having a relatively low power duplexer or diplexer filter electrically connected to a coupled port of a directional coupler can allow each aggregated carrier to be separated and processed independently for controlling the power of each carrier. Insertion loss of the carrier aggregated directional coupler 12 can only impact carrier aggregated path 32 in the electronic system 30. Accordingly, other RF signal paths 29A to 29C should not be impacted by the insertion loss of the illustrated directional coupler 12. Including other standard carriers should not add additional loss or complexity.

The illustrated electronic system 30 includes the carrier aggregated path 32, the other RF signal paths 29A to 29C, an antenna switch 37, and the antenna 19. As illustrated, the carrier aggregated path 32 includes power amplifiers 11A, 11B, transmit/receive switches 21A/21B, low noise amplifiers 22A/22B, band pass filters 23A, 23B, a diplexer 18, a directional coupler 12, a termination impedance 13, and a power detection diplexer 31. In the electronic system 30, the antenna select switch 32 can be disposed in a signal path between the directional coupler 12 and the antenna 19. The antenna select switch 32 can electrically couple a selected signal path to the antenna 19. The other RF signal paths 29A to 29C can be implemented in accordance with any of the principles and advantages associated with RF signal paths discussed herein. One or more of the other RF signal paths 29A to 29C can be carrier aggregated signal paths. Alternatively or additionally, one or more of the other RF signal paths 29A to 29C can be single carrier signal paths.

Figure 4B:
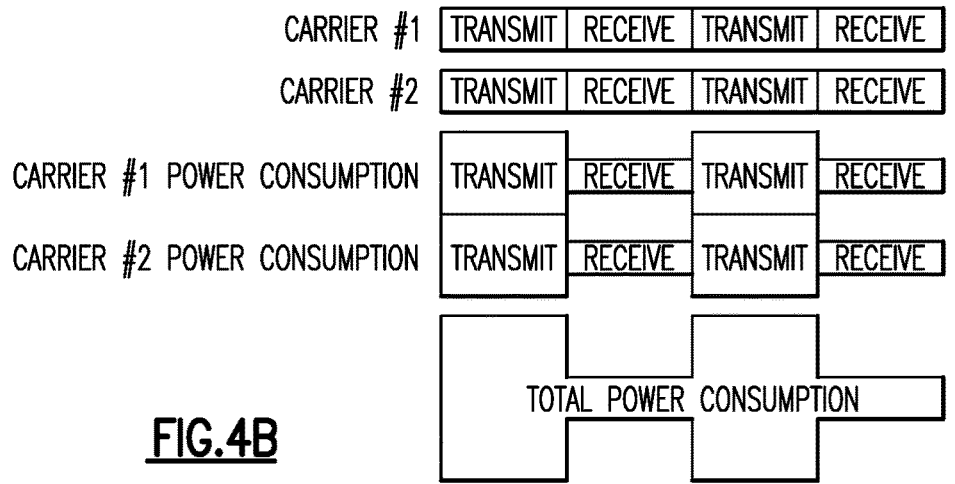
FIG. 4B is an illustrative diagram of timing of time division duplexing with overlapping transmission and associated power consumption in the electronic system of FIG. 4A.

FIG. 4B is an illustrative diagram of timing of time division duplexing with overlapping transmission and associated power consumption in the electronic system 30 of FIG. 4A. As shown in FIG. 4B, a first RF path associated with a first carrier and a second RF path associated with a second carrier can be in transmit mode at the same time. These two RF paths can be included in the carrier aggregated path 32 of FIG. 4A. An indication of RF power of the aggregated carrier can be provided by the directional coupler 12. The diplexer 31 can frequency multiplex the indication of RF power of the aggregated carrier to provide an indication of RF power of the first carrier to a first power detector and an indication of RF power of the second carrier to a second power detector.

The illustrated electronic system 30 can be implemented with individual SAW filters combined via the diplexer 18. Any suitable principles and advantages discussed with reference to the electronic system 30 can be implemented in connection with other electronic systems, such electronic systems with a single SAW duplexer, a single BAW duplexer, or a single FBAR Duplexer.

In TDD systems and/or FDD systems transmitting an inter-band carrier aggregated signal that includes carriers associated with more than one band, a power control method can be implemented using independent directional couplers located in a signal path between a power amplifier and a sub-band frequency limiting filter. Examples of more than one band that can be aggregated include, but are not limited to, (a) low band (LB) (e.g., 699 MHz-915 MHz) and mid band (MB) (e.g., 1710 MHz-2025 MHz), (b) LB and high band (HB) (e.g., 2300 MHz-2695 MHz), and (c) MB and HB. Sub-band frequency limiting filtering can be implemented by a diplexer used to combine LB and MB, a duplexer or multiple duplexers and band select switch, TDD band limiting filters, a LB and MB and HB triplexer, power isolation via antenna separation, the like or any combination thereof.

Figure 5A:
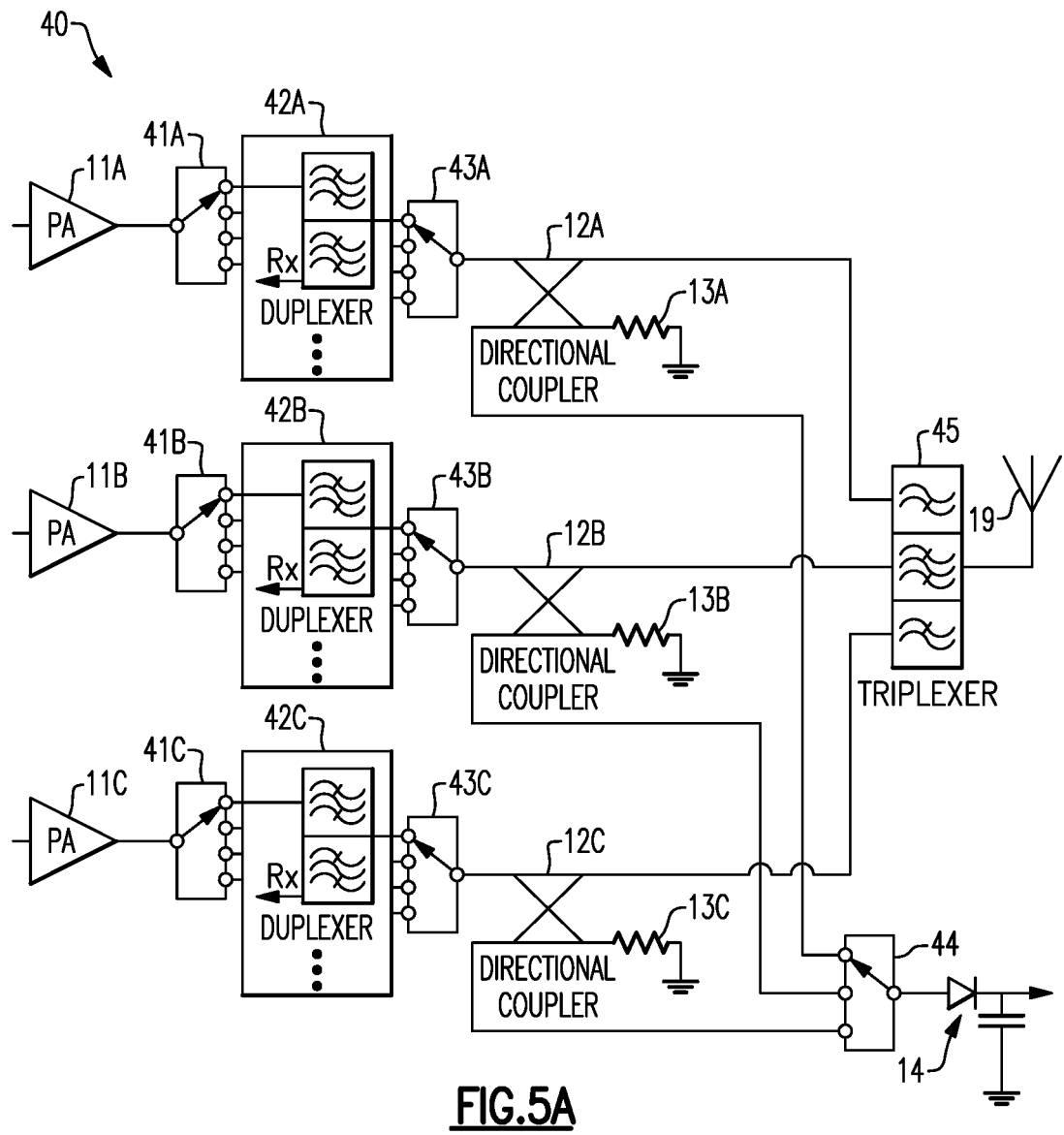
FIG. 5A is a schematic diagram of an electronic system with uplink carrier aggregation and power detection of individual carriers according to another embodiment.

FIG. 5A is a schematic diagram of an electronic system 40 with uplink carrier aggregation and power detection of individual carriers according to an embodiment. The electronic system 40 can implement power detection of individual carriers of an aggregated carrier in a TDD and/or FDD system. A frequency multiplexing circuit, such as a diplexer or a triplexer, can provide isolation between low band, mid band and high band frequencies to isolate the directional couplers associated with individual carriers from the alternate aggregated carrier associated with two or more other individual carriers. A switch may be used to select between different directional couplers in systems with fewer power detectors than directional couplers. Each directional coupler can be configured for enhanced and/or optimized performance for a particular frequency range (e.g., the low band, mid band or high band frequency ranges) to improve performance.

The illustrated electronic system 40 includes power amplifiers 11A, 11B, 11C, switches 41A, 41B, 41C, duplexers 42A, 42B, 42C, switches 43A, 43B, 43C, directional couplers 12A, 12B, 12C, termination impedances 13A, 13B, 13C, select switch 44, power detector 14, triplexer 45, and antenna 19. The power amplifiers 11A, 11B, and 11C can each transmit an amplified RF signal associated with a different carrier. Switches 41A, 41B, and 41C together with respective switches 43A, 43B, and 43C can electrically couple respective power amplifiers 11A, 11B, and 11C to respective directional couplers 12A, 12B, and 12C by way of duplexers 42A, 42B, and 42C. Duplexers 42A can be implemented by a bank of duplexers that are each associated with a different frequency bands and/or other filtering characteristics (e.g., out of band attenuation, in band attenuation, etc.). Similarly, duplexers 42B and/or 42C can be implemented by a bank of duplexers that are each associated with a different frequency bands and/or other filtering characteristics (e.g., out of band attenuation, in band attenuation, etc.).

Directional couplers 12A, 12B, and 12C can each provide an indication of RF power associated with a respective carrier. Termination impedances 13A, 13B, and 13C can be configured to enhance and/or optimize performance of a respective directional coupler for frequency of a carrier associated with the respective directional coupler. The select switch 44 can electrically couple a selected directional coupler 12A, 12B, or 12C to the power detector 14. As such, the switch 44 can be used to share a single power detector 14 among a plurality of directional couplers 12A, 12B, and 12C. With other switch arrangements, directional couplers can be arranged to utilize two detectors for various combinations of inter-band carrier aggregation, such as (a) LB and MB, (b) LB and HB, or (c) MB and HB. In another embodiment (not illustrated), a separate power detector can be provided for each directional coupler 12A, 12B, and 12C. The triplexer 45 is a frequency multiplexing circuit that can provide isolation between a carrier aggregated signal and RF signals associated with individual carriers.

In the illustrated electronic system 40, relatively high isolation of each detected carrier signal from the other carrier can be provided due to isolation provided by (1) out-of-band filtering of each duplexer 42A, 42B, and 42C, (2) out-of-band isolation of the antenna triplexer 45, and (3) the directivity of a forward port of a selected directional coupler 12A or 12B or 12C to the reverse-travelling wave of the residual interfering carrier(s).

Figure 5B:
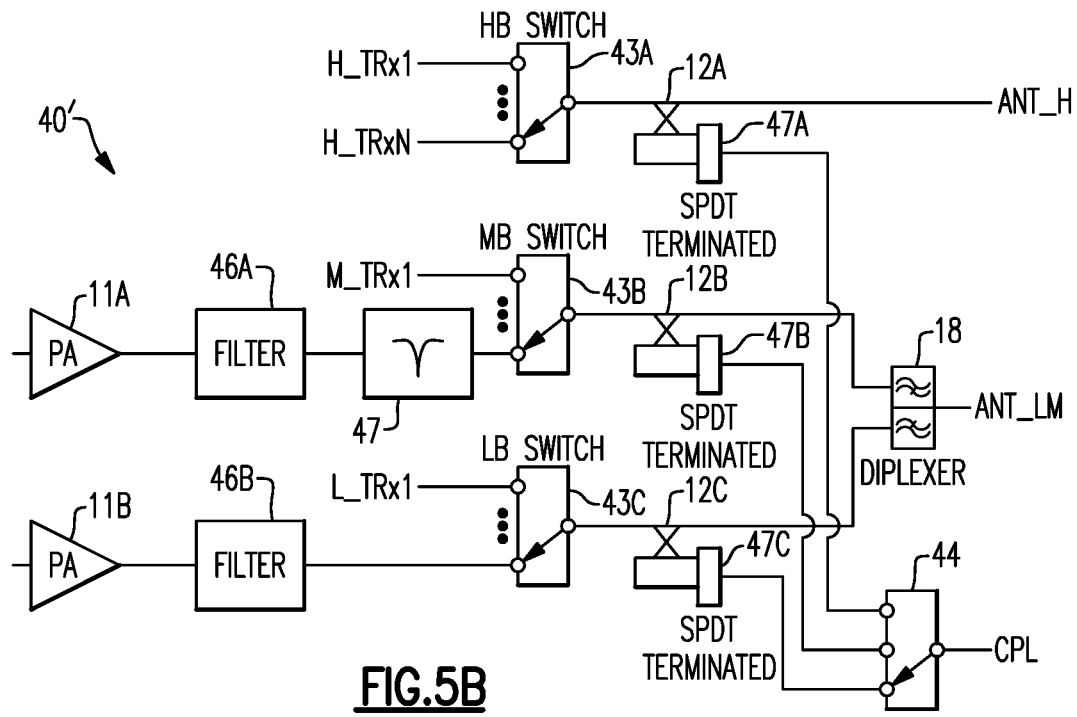
FIG. 5B is a schematic diagram of an electronic system with carrier aggregation and power detection of individual carriers according to another embodiment.

FIG. 5B is a schematic diagram of an electronic system 40' with carrier aggregation and power detection of individual carriers according to an embodiment. The electronic system 40' can be implemented in downlink carrier aggregation systems, for example. As illustrated, the electronic system 40' includes power amplifiers 11A and 11B, filters 46A and 46B configured to filter outputs of the power amplifiers 11A and 11B, respectively, switches 43A, 43B, and 43C, directional couplers 12A, 12B, and 12C, coupler terminations 47A, 47B, and 47C, select switch 44, and diplexer 18.

The electronic system 40' includes circuits that are similar to the electronic system 40 of FIG. 5A. The electronic system 40' includes the diplexer 18 to combine two of the three illustrated paths associated with individual carriers, such as LB and MB carrier paths. In contrast, the electronic system 40 of FIG. 5A includes a triplexer 45 to combine three paths associated with individual carriers.

A coupled out output port CPL can provide an indication to a detector, which is not illustrated in FIG. 5B. Any of the detectors discussed herein can be implemented internal or external to an electronic module or device than an associated directional coupler, depending on a particular application.

The coupler terminations 47A, 47B, and 47C associated with directional couplers 12A, 12B, and 12C, respectively, can enable these directional couplers to provide an indication of forward power in one state and an indication of reverse power in another state. For instance, the coupler terminations 47A, 47B, and 47C can provide respective termination impedances to different coupler ports in different states. Such features can be implemented with any other embodiments discussed herein as suitable.

Figure 5C:
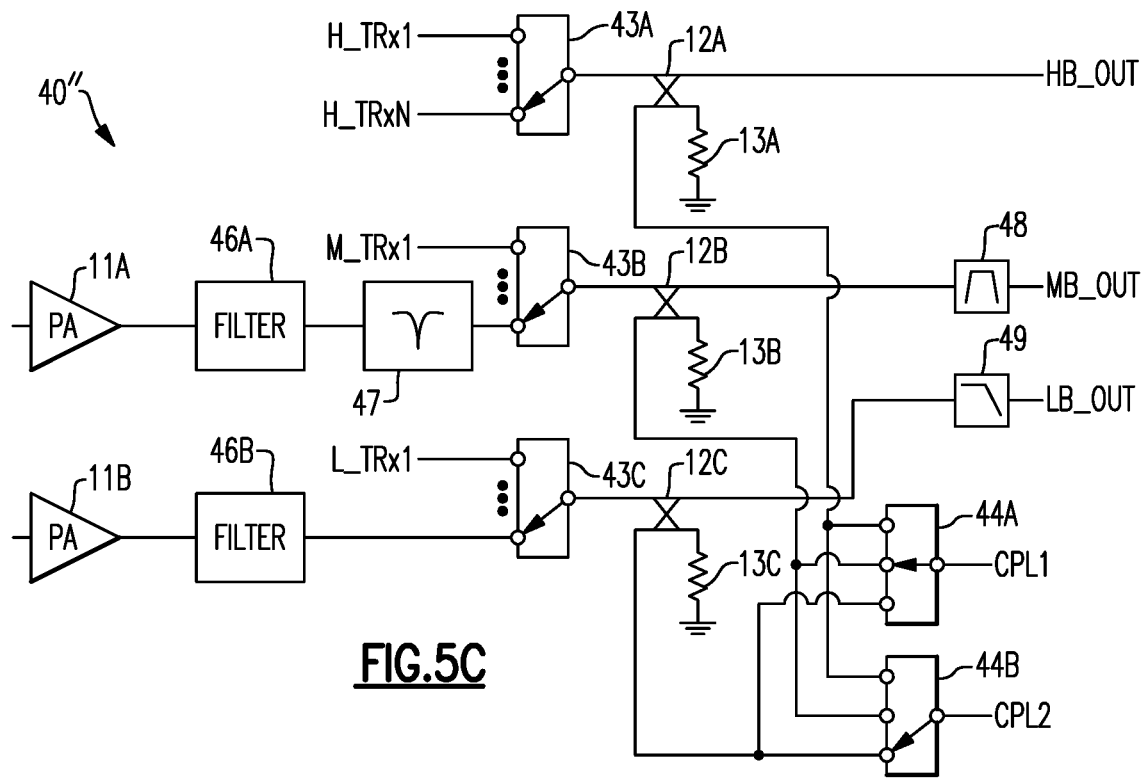
FIG. 5C is a schematic diagram of an electronic system with carrier aggregation and power detection of individual carriers according to another embodiment.

FIG. 5C is a schematic diagram of an electronic system 40" with carrier aggregation and power detection of individual carriers according to an embodiment. The electronic system 40" can be implemented in downlink carrier aggregation systems, for example. The electronic system 40" includes circuits that are similar to the electronic system 40' of FIG. 5B. Some differences between the electronic system 40" and the electronic system 40' include that the electronic system 40" provides LB, MB, and HB outputs that can allow more flexibility in combining carriers in a path to an antenna and there are a plurality of coupled out output ports CPL1 and CPL2. With two coupled out output ports CPL1 and CPL2, select switches 44A and 44B can provide outputs of two of the three illustrated directional couplers to two power detectors. FIG. 5C illustrates that a notch filter 47 can be included in a signal path between a power amplifier 22A and a directional coupler 12B in certain embodiments. FIG. 5C illustrates that outputs of directional couplers 12B and 12C can be filtered by a band pass filter 48 and a low pass filter 49, respectively, in signal paths between directional couplers 12B and 12C and a frequency multiplexing circuit and/or an antenna.

Figure 6A:
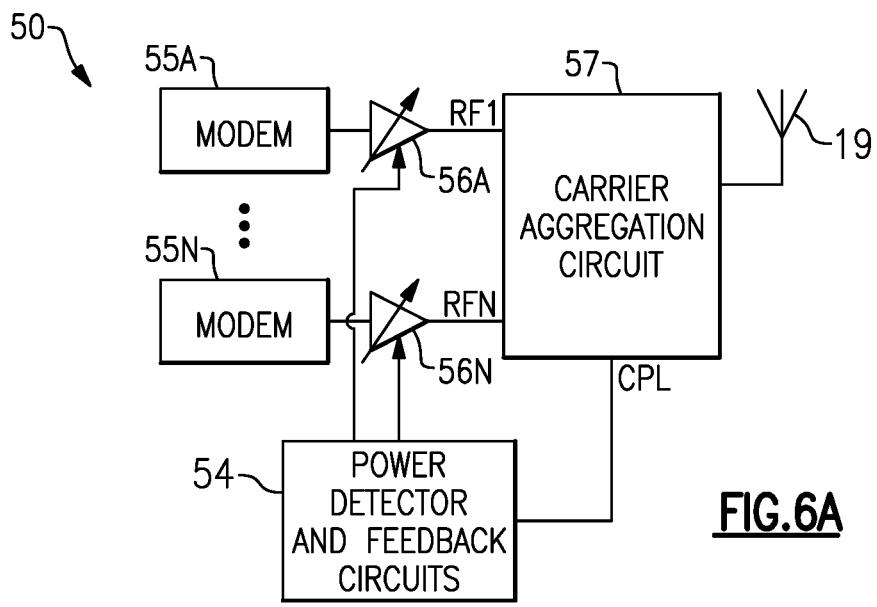
FIG. 6A is a schematic diagram of a closed loop power control system according to an embodiment.

FIG. 6A is a schematic diagram of a carrier aggregation system 50 with closed loop power control according to an embodiment. An indication of RF power associated with an individual carrier can be used to control a power of an individual carrier in a carrier aggregation system based on a detected power of the individual carrier. The illustrated electronic system 50 includes power detection and feedback control circuit 54, modems 55A to 55N, amplifiers 56A to 56N, carrier aggregation circuit 57, and antenna 19. The feedback control circuit 54, modems 55A to 55N, and amplifiers 56A to 56N can together implement a power control system. The carrier aggregation circuit 57 can include any suitable carrier aggregation signal path discussed herein. The carrier aggregation circuit 57 can provide an indication of power associated with an individual carrier of a carrier aggregated signal. The power detection and feedback control circuit 54 can adjust a power level associated with an amplifier of the amplifiers 56A to 56N that is associated with the individual carrier based on the indication of power associated with the individual carrier. By adjusting a power level associated with a selected amplifier of the amplifiers 56A to 56N, a power level of an RF source, such as a power amplifier, of the carrier aggregation circuit 57 can accordingly be adjusted.

Figure 6B:
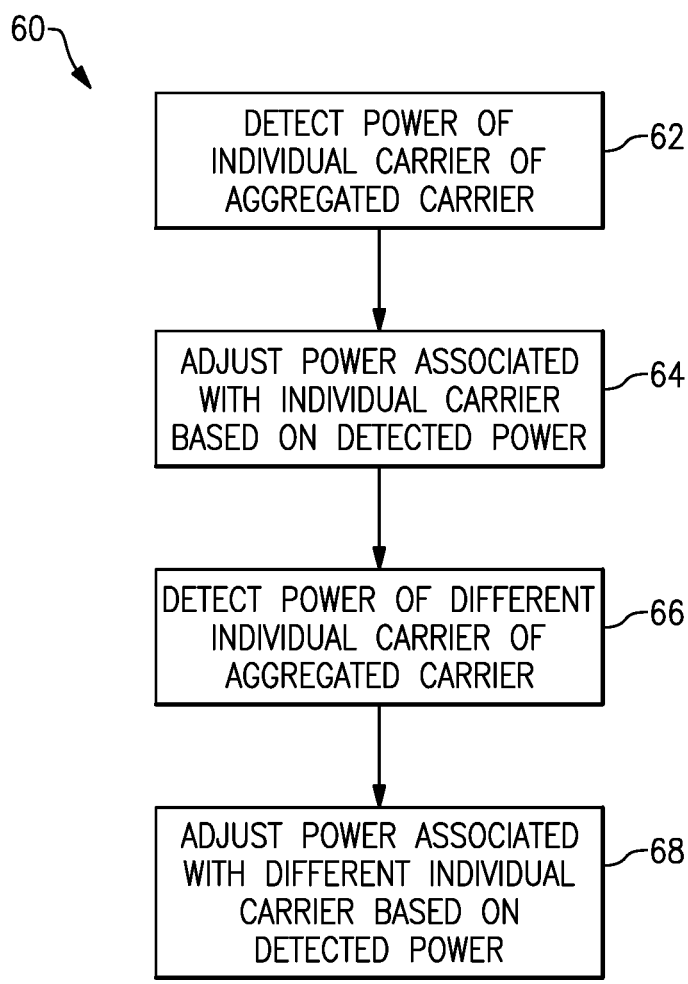
FIG. 6B is a flow diagram of an illustrative process of controlling power of individual carriers of a carrier aggregated signal according to an embodiment.

FIG. 6B is a flow diagram of an illustrative process 60 of controlling power of individual carriers of a carrier aggregated signal according to an embodiment. Some or all of the process 60 can be implemented with any of the embodiments discussed herein as suitable. The process 60 can be performed on a mobile device. It will be understood that any of the methods discussed herein may include more or fewer operations than illustrated on a flow diagram and the operations may be performed in any appropriate order.

At block 62, power of an individual carrier of an aggregated carrier is detected. Detecting power of the individual carrier can involve using a power detector coupled to any suitable directional coupler discussed herein. As one example, detecting the indication of power of the individual carrier can be based on an output of a directional coupler coupled between a frequency multiplexing circuit and an antenna. As another example, detecting the indication of power of the individual carrier can be based on an output of a directional coupler coupled between a power amplifier and a multi-throw radio frequency switch. The power associated with the individual carrier can be adjusted based on the detected power associated with the individual carrier at block 64. For instance, the power associated with a selected amplifier of the amplifiers 56A to 56N of FIG. 6A can be adjusted using a control signal provided a power detector and feedback control circuit 54 of FIG. 6A.

At block 66, power of a different individual carrier of the aggregated carrier is detected. Detecting power of the different individual carrier at block 66 can involve a different directional coupler than detecting power of the individual carrier at block 62 in certain embodiments. Detecting power of the different individual carrier at block 66 can involve the same directional coupler as detecting power of the individual carrier at block 62 in some other embodiments. Power associated with the different individual carrier can be adjusted based on the detected power associated with the different individual carrier at block 68. Accordingly, power associated with a plurality of individual carriers of a carrier aggregated signal can be adjusted based on detected power associated with respective individual carriers.

Figure 6C:
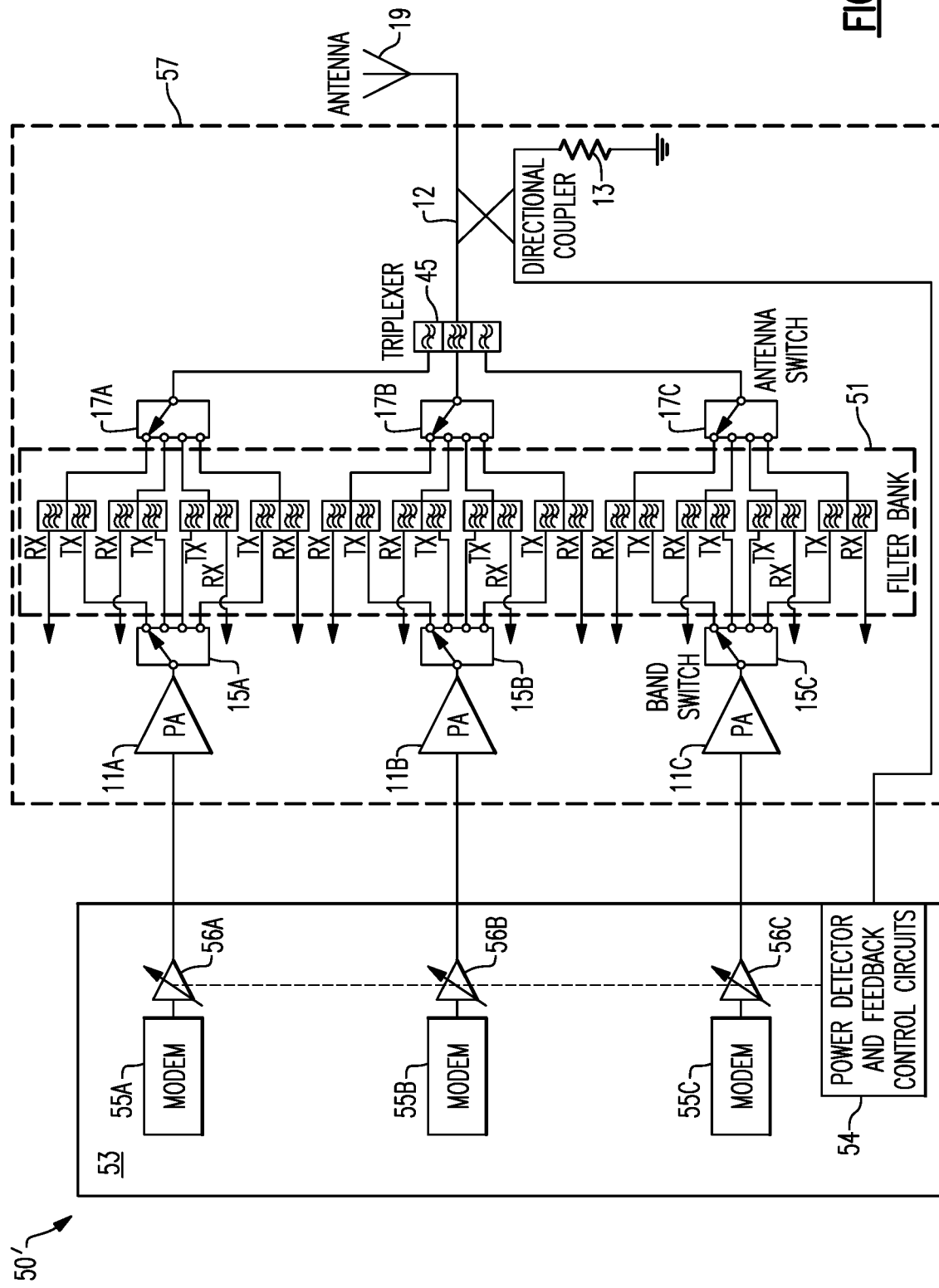
FIG. 6C is a schematic diagram of a closed loop power control system according to another embodiment.

FIG. 6C is a schematic diagram of a carrier aggregation system 50' with closed loop power control 50 according to an embodiment. An indication of RF power associated with an individual carrier provided by a directional coupler, a power detector, or a duplexer, etc. can be used to control power of an RF signal provided to an RF source, such as a power amplifier. The illustrated system 50' includes a power control system 53. As shown in FIG. 6C, a directional coupler 12 can provide an indication of RF power of an individual carrier or a carrier aggregated signal to a power detector and feedback control circuit 54. The power detector and feedback control circuit 54 can include a power detector, such as a power detector 14, and a feedback control circuit configured to generate a control signal based at least partly on the indication of RF power of the individual carrier. A modem 55A, 55B, or 55C can provide a carrier signal to an amplifier 56A, 56B, 56C, respectively. A power of the output of an amplifier 56A, 56B, or 56C can be controlled by a control signal provided by the power detector and feedback control circuit 54. This can control a power of an individual carrier in a carrier aggregation system based on a detected power of the individual carrier. Any of these principles and advantages can be applied to controlling power of two or more individual carriers associated with a carrier aggregated signal. In certain embodiments, the principles and advantages discussed herein can be applied to control power of each carrier of a carrier aggregated signal. Any of the carrier aggregated signals discussed herein can be an aggregation associated with two or more carriers.

Figure 7:
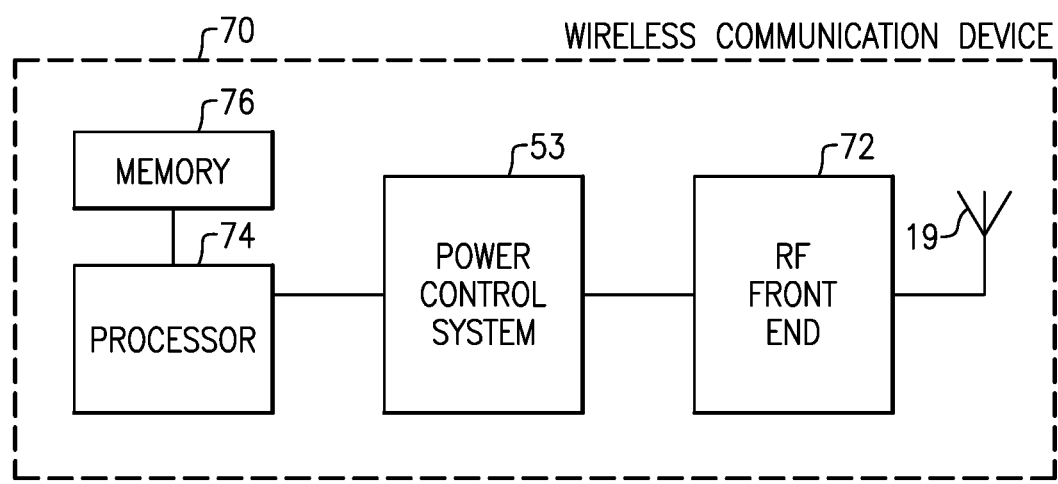
FIG. 7 is a schematic block diagram of an example wireless communication device that can include any combination of features of the power detection of individual carriers of an aggregated signal discussed herein.

FIG. 7 is a schematic block diagram of an example wireless communication device 70 that can include any suitable combination of features related to the power detection of an individual carrier of a carrier aggregated signal discussed herein. The wireless communication device 70 can be any suitable wireless communication device. For instance, this device can be a mobile phone such as a smart phone. As illustrated, the wireless communication device 70 includes an antenna 19, an RF front end 72, a power control system 52, a processor 74, and memory 76. Any of the carrier aggregated signal paths and/or carrier aggregation circuits discussed herein can be implemented in the RF front end 72. The RF front end 72 can provide a carrier aggregated RF signal to the antenna 19 for transmission. The RF front end 72 can also process an RF signal received by the antenna 19. The memory 76 can store data on the wireless communication device 70. The processor 74 can store and/or access data in the memory 76. The processor 74 can process baseband signals. As illustrated, the power control system 53 is coupled between the processor 74 and the RF front end 72. The power control system 53 can implement any of the principles and advantages discussed in connection with any of FIGS. 6A to 6C.

Some of the embodiments described above have provided examples in connection with power amplifiers and/or mobile devices. However, the principles and advantages of the embodiments can be used for any other systems or apparatus that could benefit from any of the principles and advantages described herein. For instance, power amplifiers are examples of RF sources that provide RF signals and any suitable combination of features discussed herein can be implemented in connections with other RF sources. Any of the principles and advantages discussed herein can be implemented in an electronic system with a need for detecting and/or controlling a power level of an individual carrier of an aggregated carrier. While embodiments may have been discussed above with reference to uplink carrier aggregated systems, any suitable principles and advantages discussed herein can be applied to downlink carrier aggregation systems. Any suitable principles and advantages of an embodiment discussed with reference to a particular type or types of carrier aggregation (e.g., FDD, TDD with non-overlapping transmission, TDD with overlapping transmission) can be implemented in connection with a different type of carrier aggregation as suitable. Any suitable principles and advantages of an embodiment discussed with reference to inter-band carrier aggregation can be implemented in connection with intra-band carrier aggregation as suitable. The teachings herein are applicable to a variety of power amplifier systems including systems with multiple power amplifiers, including, for example, multi-band and/or multi-mode power amplifier systems. The power amplifier transistors discussed herein can be, for example, gallium arsenide (GaAs), complementary metal oxide semiconductor (CMOS), or silicon germanium (SiGe) transistors. Moreover, power amplifiers discussed herein can be implemented by FETs and/or bipolar transistors, such as heterojunction bipolar transistors.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, an electronic module configured for use in a mobile phone, an electronic module configured for use in a base station, a telephone, a television, a computer monitor, a computer, a modem, a hand-held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "electrically coupled", as generally used herein, refer to two or more elements that may be either directly electrically connected, or electrically connected by way of one or more intermediate elements. Likewise, the word "connected", as generally used herein, refers to two or more elements that may be either directly connected, or connected by way of one or more intermediate elements. A radio frequency signal can have a frequency in the range from 300 MHz to 300 GHz. Additionally, where appropriate, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number, respectively. The word "or" in reference to a list of two or more items, where context permits, covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A carrier aggregation system comprising:
   a first signal path including a first power amplifier associated with a first carrier, a first directional coupler configured to provide an indication of power of the first carrier, and a first radio frequency switch electrically connected to the first power amplifier by way of at least the first directional coupler;
   a second signal path including a second power amplifier associated with a second carrier, a second directional coupler configured to provide an indication of power of the second carrier, and a second radio frequency switch electrically connected to the second power amplifier by way of at least the second directional coupler; and
   a frequency multiplexing circuit configured to perform frequency domain multiplexing, the frequency multiplexing circuit including a terminal configured to provide a carrier aggregated signal, the carrier aggregated signal including an aggregation of at least the first carrier and the second carrier.

2. The carrier aggregation system of claim 1 wherein the first radio frequency switch is a band select switch.

3. The carrier aggregation system of claim 1 wherein the first radio frequency switch is a transmit/receive switch.

4. The carrier aggregation system of claim 1 wherein the first radio frequency signal path includes a band pass filter, and the band pass filter is coupled between the first radio frequency switch and the frequency multiplexing circuit.

5. The carrier aggregation system of claim 4 wherein the band pass filter is included in a duplexer.

6. The carrier aggregation system of claim 1 wherein the first power amplifier is a multi-mode, multi-band power amplifier.

7. The carrier aggregation system of claim 1 wherein the frequency multiplexing circuit is a diplexer.

8. The carrier aggregation system of claim 1 wherein the carrier aggregated signal is a frequency division duplexing carrier aggregated signal.

9. The carrier aggregation system of claim 1 wherein the first directional coupler is configurable such that (i) the indication of power of the first carrier is an indication of forward power in a first state and (ii) the indication of power of the first carrier is an indication of reverse power in a second state.

10. A carrier aggregation system comprising:
    a first signal path including a first power amplifier associated with a first carrier, a first radio frequency switch, and a first directional coupler configured to provide an indication of power of the first carrier, the first directional coupler electrically connected to the first power amplifier by way of at least the first radio frequency switch;
    a second signal path including a second power amplifier associated with a second carrier, a second radio frequency switch, and a second directional coupler configured to provide an indication of power of the second carrier, the second directional coupler electrically connected to the second power amplifier by way of at least the second radio frequency switch; and a frequency multiplexing circuit configured to perform frequency domain multiplexing, the frequency multiplexing circuit including a terminal configured to provide a carrier aggregated signal, the carrier aggregated signal including an aggregation of at least the first carrier and the second carrier.

11. The carrier aggregation system of claim 10 wherein the first radio frequency switch is a band select switch.

12. The carrier aggregation system of claim 10 wherein the first radio frequency signal path includes a band pass filter, and the band pass filter is coupled between the first directional coupler and the frequency multiplexing circuit.

13. The carrier aggregation system of claim 10 wherein the first directional coupler is configurable such that the indication of power of the first carrier is an indication of forward power in one state and the indication of power of the first carrier is an indication of reverse power in another state.

14. The carrier aggregation system of claim 10 further comprising a select switch and a power detector, the power detector configured to receive the indication of power of the first carrier from the first directional coupler by way of at least the select switch, and the power detector configured to receive the indication of power of the second carrier from the second directional coupler by way of at least the select switch.

15. A carrier aggregation system comprising:
a first signal path including first power amplifier associated with a first carrier;
a second signal path including a second power amplifier associated with a second carrier;
a directional coupler; and
an antenna switch configured to selectively electrically connect the first signal path and the second signal path to the directional coupler, the antenna switch configured to provide a carrier aggregated signal, the carrier aggregated signal including an aggregation of at least the first carrier and the second carrier.

16. The carrier aggregation system of claim 15 wherein the directional coupler is configured to provide an indication of power of the first carrier at a first time and an indication of power of the second carrier at a second time.

17. The carrier aggregation system of claim 15 wherein the carrier aggregated signal is a time division duplexing carrier aggregated signal.

18. The carrier aggregation system of claim 15 wherein the directional coupler is configured to provide an indication of forward power in a first state and an indication of reverse power in a second state.

19. The carrier aggregation system of claim 15 further comprising a frequency multiplexing circuit configured to perform frequency domain multiplexing, the frequency multiplexing circuit electrically connected to the directional coupler by way of at least the antenna switch.

20. The carrier aggregation system of claim 15 wherein the first signal path further includes a radio frequency switch and a band pass filter.

* * * * *